(12) United States Patent  
Silverstein et al.

(10) Patent No.: US 7,450,386 B2
(45) Date of Patent: Nov. 11, 2008

(54) PHASE-SEPARATED EVAPORATOR, BLADE-THRU CONDENSER AND HEAT DISSIPATION SYSTEM THEREOF

(75) Inventors: Paul Silverstein, Miami, FL (US); Frederick K. Husher, Pembroke Pines, FL (US); Jee Shum, Miramar, FL (US)

(73) Assignee: ArticChoke Enterprises LLC

( * ) Notice: Subject to any disclaimer, the term of this patent is extended or adjusted under 35 U.S.C. 154(b) by 20 days.

(21) Appl. No.: 11/800,248

(22) Filed: May 5, 2007

(65) Prior Publication Data

US 2008/0030956 A1 Feb. 7, 2008

Related U.S. Application Data

(63) Continuation-in-part of application No. 11/494,238, filed on Jul. 27, 2006.

(60) Provisional application No. 60/797,848, filed on May 6, 2006, provisional application No. 60/703,945, filed on Jul. 30, 2005.

(51) Int. Cl.
*H05K 7/20* (2006.01)

(52) U.S. Cl. .................. 361/700; 361/699; 361/704; 165/80.4; 165/104.33; 165/104.26; 174/15.1; 174/15.2; 257/715

(58) Field of Classification Search .................. None
See application file for complete search history.

(56) References Cited

U.S. PATENT DOCUMENTS 5,477,917 A * 12/1995 Salyer .................. 165/104.26

| 6,526,768 | B2 * | 3/2003 | Wall et al. .................. 62/184 |
| 6,820,684 | B1 * | 11/2004 | Chu et al. .............. 165/104.33 |
| 6,990,816 | B1 * | 1/2006 | Zuo et al. .................. 62/3.7 |
| 6,994,151 | B2 * | 2/2006 | Zhou et al. .................. 165/80.4 |
| 7,104,078 | B2 * | 9/2006 | Tilton .................. 62/121 |
| 7,305,850 | B2 * | 12/2007 | Tonkovich et al. .................. 62/617 |
| 2003/0205363 | A1 * | 11/2003 | Chu et al. .................. 165/80.3 |
| 2004/0075181 | A1 * | 4/2004 | Hara .................. 261/99 |
| 2005/0061487 | A1 * | 3/2005 | Kroliczek et al. .......... 165/139 |
| 2006/0254752 | A1 * | 11/2006 | Narakino et al. .......... 165/80.4 |

* cited by examiner

*Primary Examiner*—Boris L Chervinsky
(74) *Attorney, Agent, or Firm*—Yi Li

(57) ABSTRACT

A phase-separated evaporator includes a boiler plate and a phase separation chamber that includes a housing, connected to the boiler plate, having a gas port and a liquid port; and a phase partitioner connected to interiors of the housing, dividing the phase-separated evaporator into a vapor directing compartment and a condensate directing compartment. The phase partitioner includes a partition panel and multiple feeding injectors extending from the partition panel, with the injector tips disposed immediately above the boiler plate. The returning condensate from a condenser enters from the liquid port into the condensate directing compartment and feeds onto the boiler plate through the feeding injectors; while the vapor generated in the vapor directing compartment exits from the gas port, without encountering the condensate. Further disclosed are a high efficiency heat dissipation system utilizing the phase-separated evaporator and a blade-thru condenser, and a computer system utilizing the heat dissipation system.

15 Claims, 16 Drawing Sheets

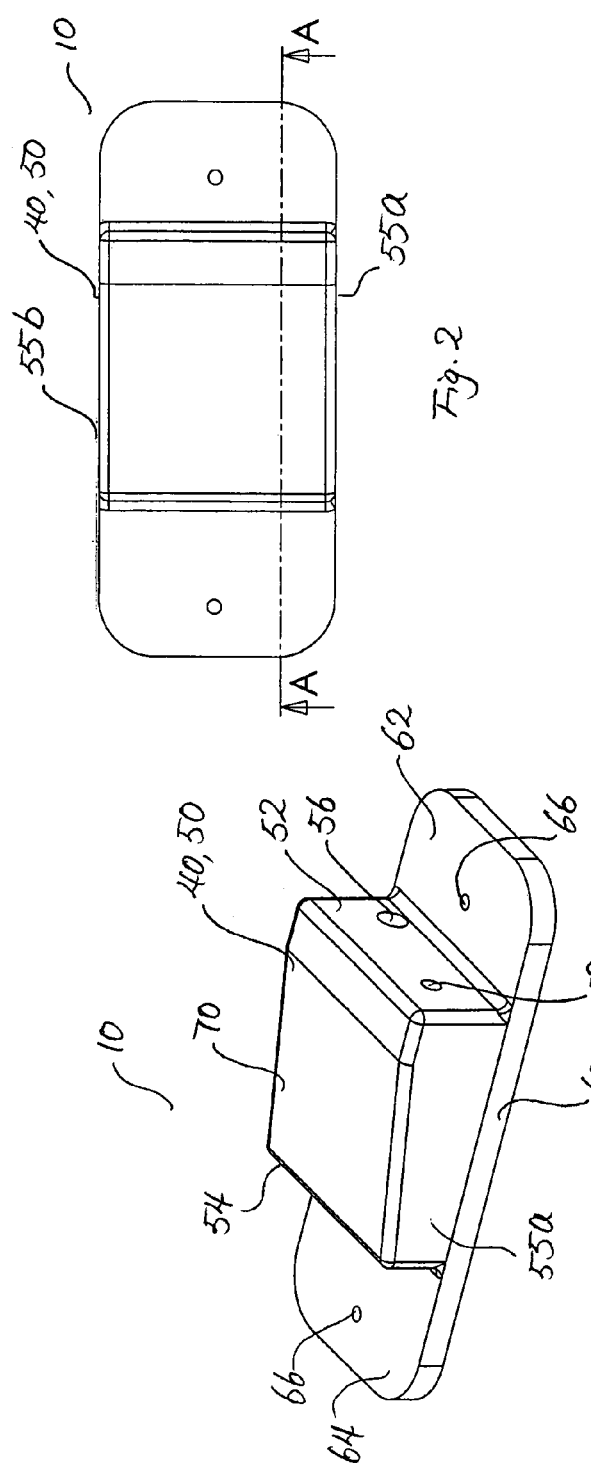

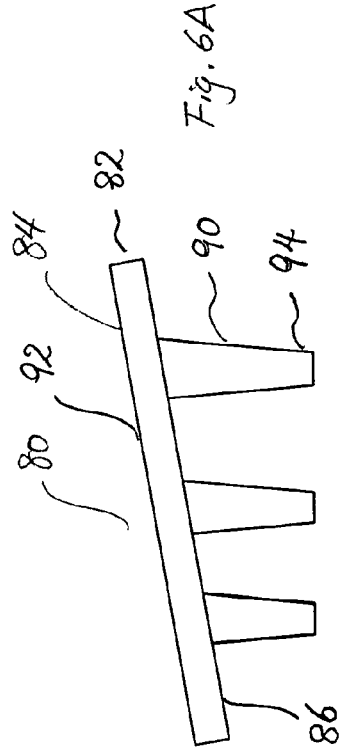
Fig. 6A
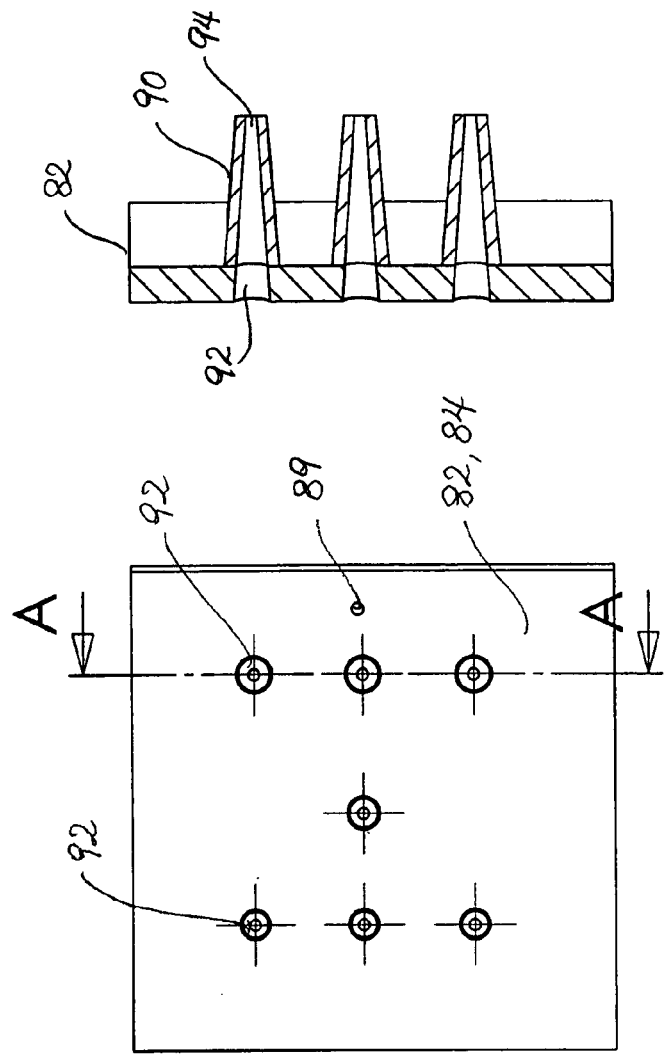
Fig. 6B
Fig. 6

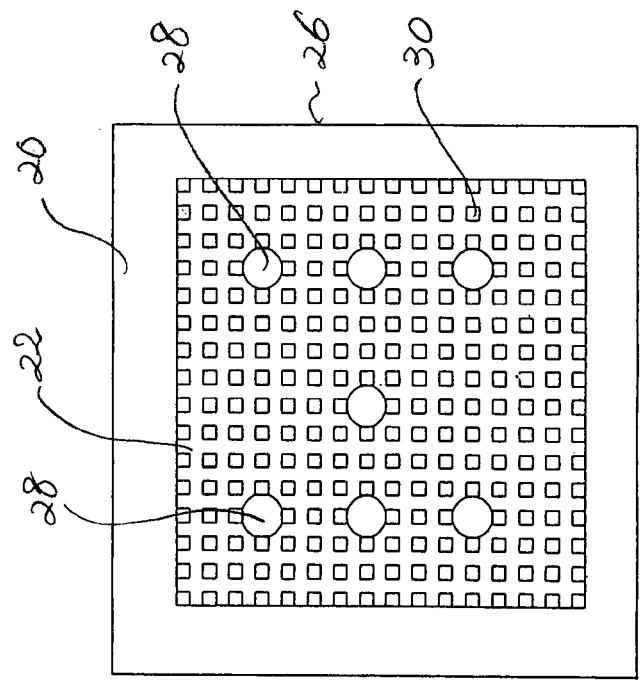
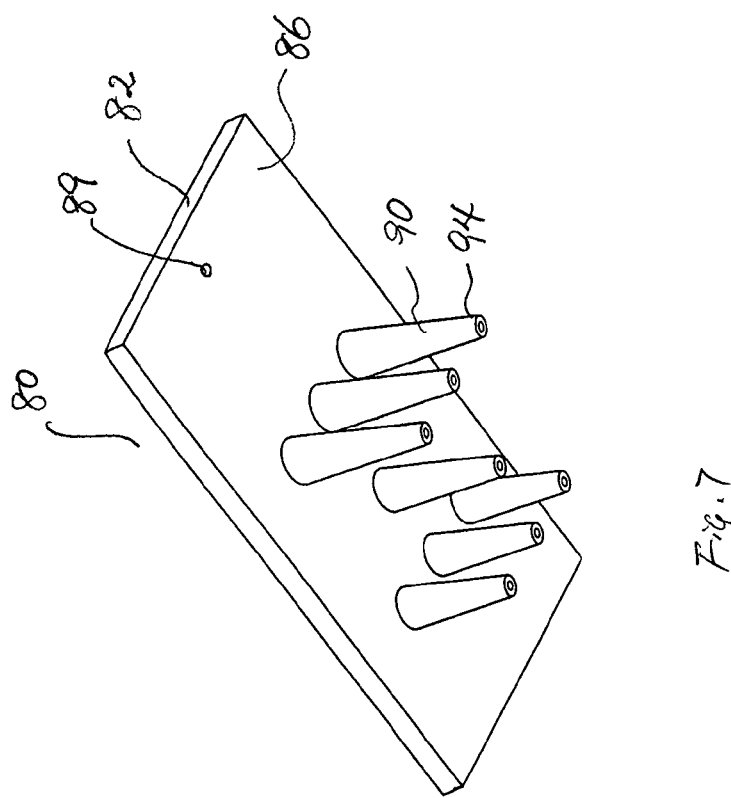
Fig. 8
Fig. 7

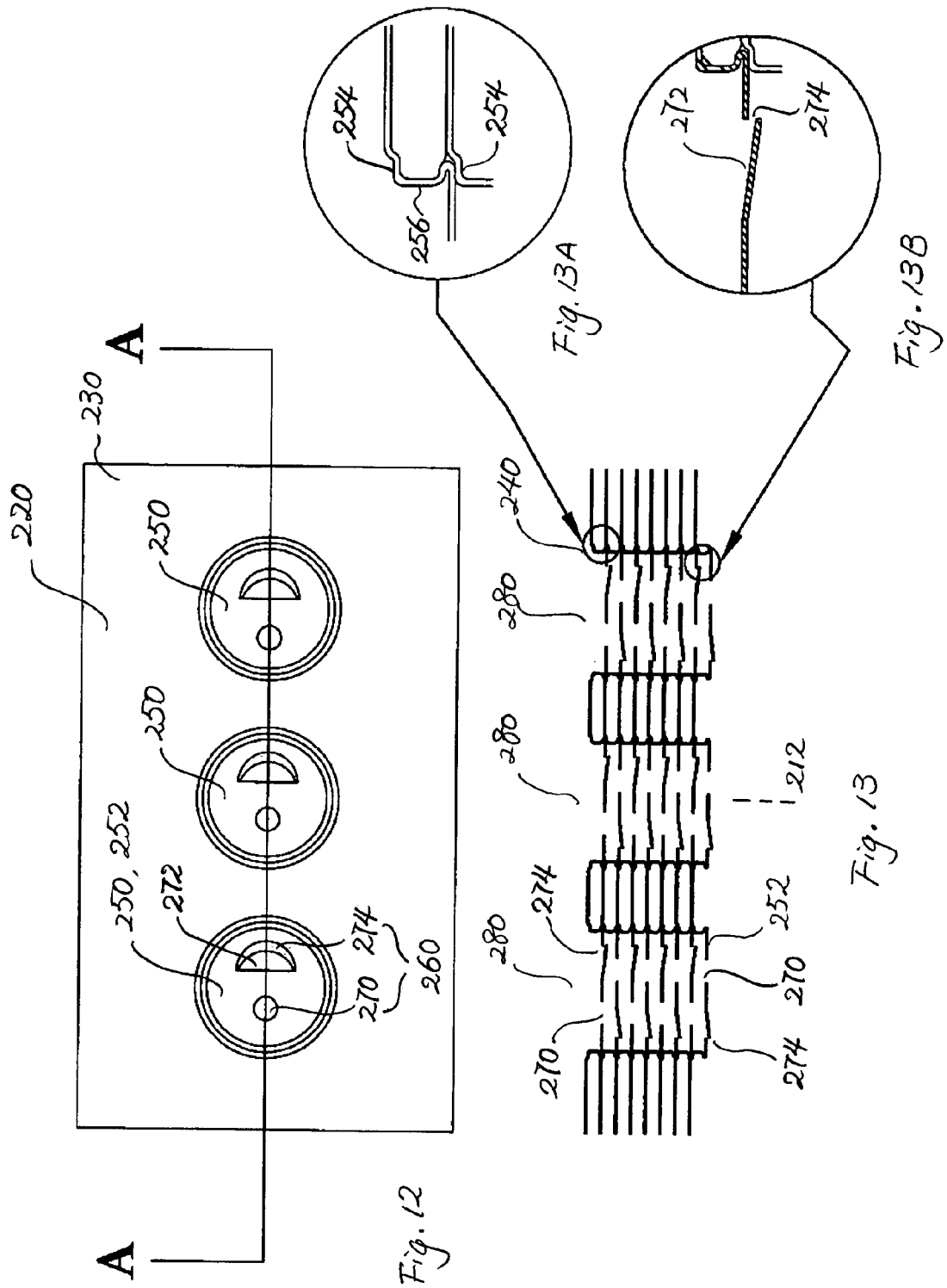

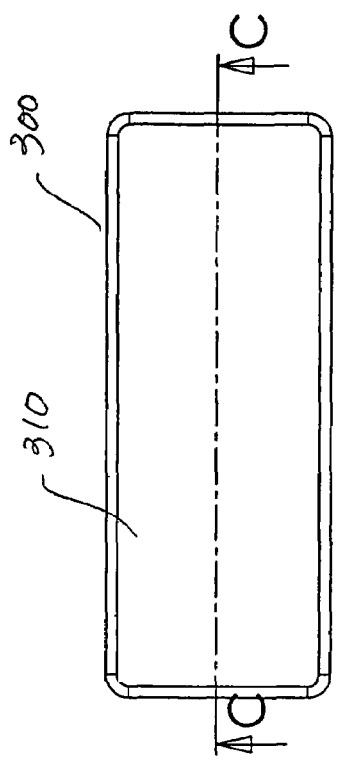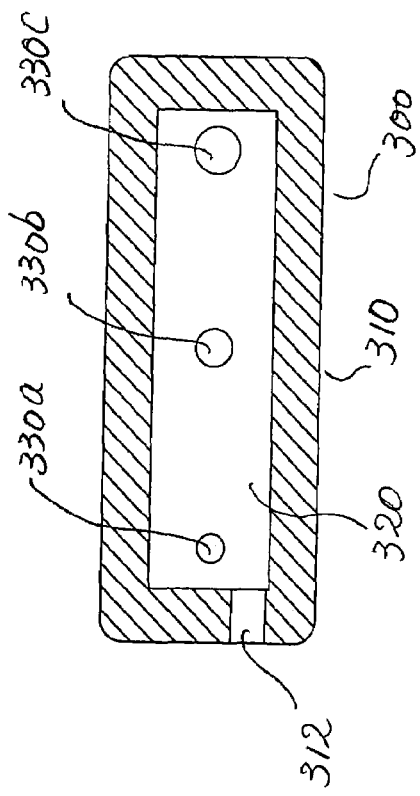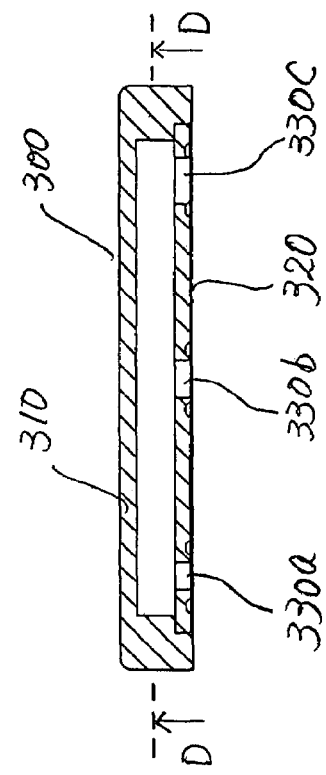

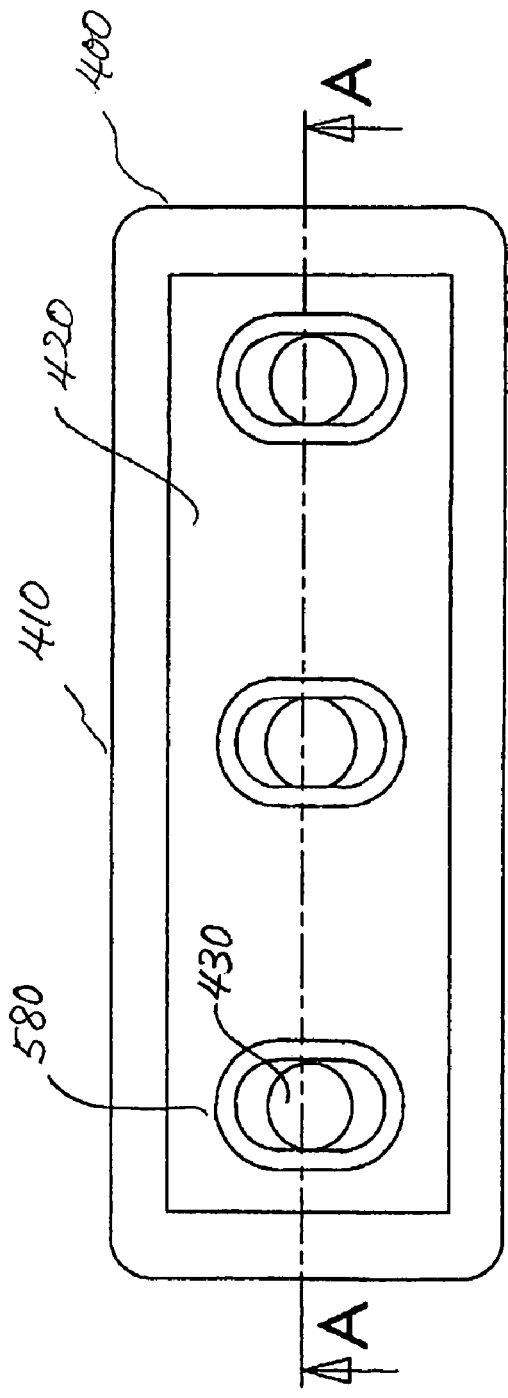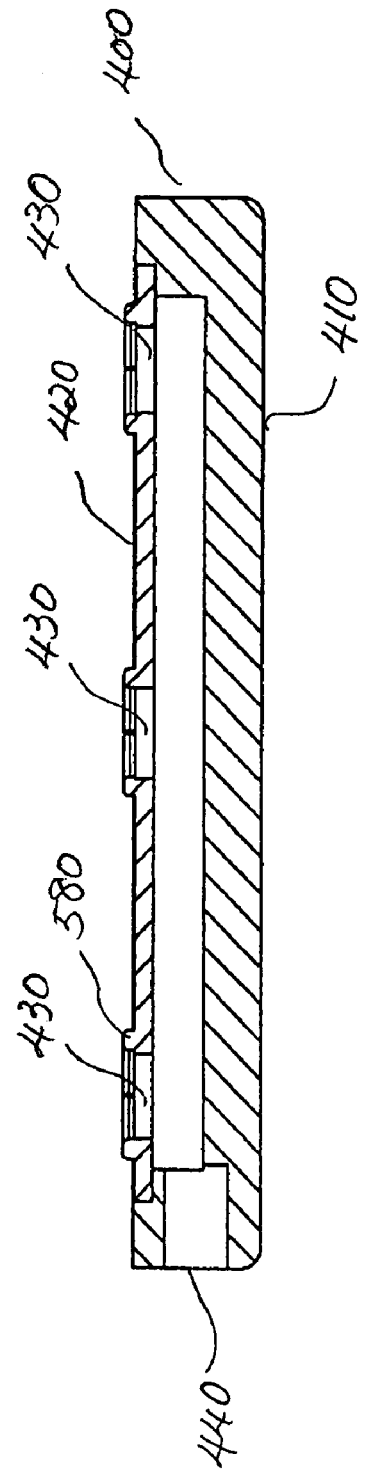

PHASE-SEPARATED EVAPORATOR, BLADE-THRU CONDENSER AND HEAT DISSIPATION SYSTEM THEREOF

CROSS REFERENCE TO RELATED APPLICATION

This application claims the benefit under 35 USC 119 (e) of the provisional patent application Ser. No. 60/797,848, filed May 06, 2006, and is a continuation-in-part of patent application Ser. No. 11/494,238, filed on Jul. 27, 2006, which claims the benefit under 35 USC 119 (e) of provisional patent application Ser. No. 60/703,945, filed Jul. 30, 2005, and provisional patent application Ser. No. 60/797,848, filed May 06, 2006. All parent patent applications are herein incorporated by reference in their entirety.

FIELD OF THE INVENTION

The present invention relates to an evaporator and a heat dissipation system utilizing the evaporator. More specifically, the evaporator includes phase-partitioner which separates the vapor and the condensate into two compartments. The present invention further relates to a high efficiency heat dissipation system utilizing the phase-separated evaporator and a blade-thru condenser.

BACKGROUND OF THE INVENTION

With the never-ending increase of computing power, effectively cooling a CPU has become a technical challenge. The present temperature limit for a CPU is approximately 60° C. As the power of a CPU increases, more heat is generated; therefore, the CPU requires a higher efficiency and capacity of the heat dissipation device in order to provide an effective thermal management to the computer system. Heat dissipation can be achieved by moving the heat generated primarily at the CPU and other components such as the memory controller, memory chips, graphics processor or power chips, to a location where it can be safely discharged to the ambient air.

One type conventional heat dissipation device is passive metal heat sinks. The heat sinks are typically made of thermally conductive metal blocks that can be attached to the cover plate of a CPU for dissipating heat. The block can be fabricated to include plurality of thin fins to increase the surface area for heat dissipation. The heat sinks are only effective to dissipate heat generated up to about 90 watts. Another type of conventional heat dissipation device is heat pipes, which are only effective to dissipate heat generated up to about 130 watts. Therefore, the conventional heat dissipation devices have very limited capacities and are inadequate for cooling the high power CPU, which operates with a power of about 235 watts or higher.

At this time the computer industry in general believes that liquid cooling is the only viable solution for the immediate future. Recently, major computer manufacturers have started to release high power computers using liquid cooling devices for thermal management. For example, Dell's new top line system XPC 700 includes a refrigerated liquid cooling system. IBM has released its Power 6 Plus chip at 5.2 GHz, which operates with a power in a range of 300 to 425 watts and is expected to be supported with liquid cooling devices. However, liquid cooling devices are expensive, noisy and difficult to maintain.

In heat dissipation devices based on the phase exchange of a coolant between the liquid and gas phases, the efficiency of the heat dissipation devices depends on both the evaporator and the condenser. Traditional evaporators only have one chamber or compartment above the boiler plate. When the generated vapor exits the evaporator, it encounters the returning condensate, this causes a premature condensation of the vapor before it exits from the evaporator. On the other hand, prior to the condensate reaches the boiler plate, the condensate is already heated up by the vapor. As such, the efficiency of the evaporator is compromised.

Based on the above, it is apparent that a strong need exists in the computer industry for improved heat dissipation devices that have higher efficiency and capacity for thermal management of computer systems. Furthermore, there is also a strong need for improved heat dissipation devices in other industries, such as automobile and air conditioning.

SUMMARY OF THE INVENTION

In one aspect, the present invention is directed to a phase-separated evaporator. In one embodiment, the phase-separated evaporator comprises a boiler plate and a phase separation chamber that comprises a housing having a base connected to the boiler plate; the housing having a liquid port and a gas port; and a phase partitioner connected to interiors of the housing, dividing the phase-separated evaporator into a condensate directing compartment and a vapor directing compartment. The condensate directing compartment is in communication with the liquid port, and the vapor directing compartment is in communication with the gas port. The phase partitioner includes a partition panel and a plurality of feeding injectors extending from the partition panel toward the boiler plate.

In a further aspect, the present invention is directed to a heat dissipation system utilizing the instant phase-separated evaporator. The heat dissipation system comprises a phase-separated evaporator as described above, a condenser, a vapor conduit connected between the gas port of the evaporator and an input interface of the condenser, and a condensate conduit connected between an output interface of the condenser and the liquid port of the evaporator. The heat dissipation system further comprises a fan positioned adjacent to the condenser, for removing hot air released from the condenser.

In one embodiment, the condenser is a blade-thru condenser. In a specific embodiment, the blade-thru condenser comprises a condenser core, an input interface, and an output interface. The condenser core comprises multiple substantially planar blades, each of the multiple blades having at least one chamber formed monolithically therein, and a floor of the chamber having at least one aperture. The multiple blades are joined in parallel alignment, with the apertures positioned to permit vapor and condensate to pass through the apertures. The apertures include at least one reed.

In a further embodiment, the blade-thru condenser comprises a condenser core that comprises multiple substantially planar blades joined in parallel by one or more spacer rings disposed between two adjacent blades. Each of the blades comprises one or more chambers formed within interiors of the spacer rings, and a floor of the chamber has at least one aperture. The chambers of the multiple blades are in alignment to permit vapor and condensate to pass through the apertures.

In another aspect, the present invention is directed to a computer system that comprises a housing, a motherboard comprising a central processing unit (CPU) and input, output interfaces, a fan disposed within the housing, and a heat dissipation system comprising the instant phase-separated evaporator with the boiler plate in a direct contact with a heat generating component of the computer and the condenser as described above. The heat generating component includes the CPU, memory controller, memory chip, graphics processor, or power chip.

The advantages of the present invention will become apparent from the following description taken in conjunction with the accompanying drawings showing the exemplary embodiments of the invention.

BRIEF DESCRIPTION OF THE DRAWINGS

FIG. 1 is a perspective exterior view of the phase-separated evaporator of one embodiment of the present invention.

FIG. 2 is a top view of the phase-separated evaporator shown in FIG. 1.

FIG. 3 is a cross-sectional view of the phase-separated evaporator of FIG. 1, along line A-A of FIG. 2.

FIGS. 6 and 6A are top and side views of the phase partitioner of the phase-separated evaporator shown in FIG. 3.

FIG. 6B is a cut-out view of the phase partitioner along line A-A of FIG. 6.

FIG. 7 is a bottom perspective view of the phase partitioner of the phase-separated evaporator shown in FIG. 3.

FIG. 8 is a top view of the boiler plate of the phase-separated evaporator shown in FIG. 3, showing the locations of the landing zones.

FIG. 12 is a top view of the condenser core of the blade-thru condenser of one embodiment of the present invention.

FIG. 13 is a partial enlarged side view of the condenser core along line A-A of FIG. 12.

FIG. 13A is a magnified side view of a solder joint between two blades of the condenser core shown in FIG. 13.

FIG. 13B is magnified cross-sectional view of a reed of the condenser core shown in FIG. 13.

FIG. 14 is a top view of the input manifold of the blade-thru condenser of FIG. 9.

FIG. 14A is a cross-sectional view of the input manifold of the blade-thru condenser along line C-C of FIG. 9.

FIG. 14B is a cross-sectional view of the input manifold of the blade-thru condenser along line D-D of FIG. 14A.

FIG. 15 is a top view of the output manifold of the blade-thru condenser of FIG. 9.

FIG. 15A is a cross-sectional view of the output manifold along line A-A of FIG. 15.

It is noted that in the drawings like numerals refer to like components.

DETAILED DESCRIPTION OF THE INVENTION

In one aspect, the present invention provides a phase-separated evaporator for enhancing the efficiency of an evaporator in liquid-gas phase exchange process and the efficiency of heat dissipation.

Figure 4:
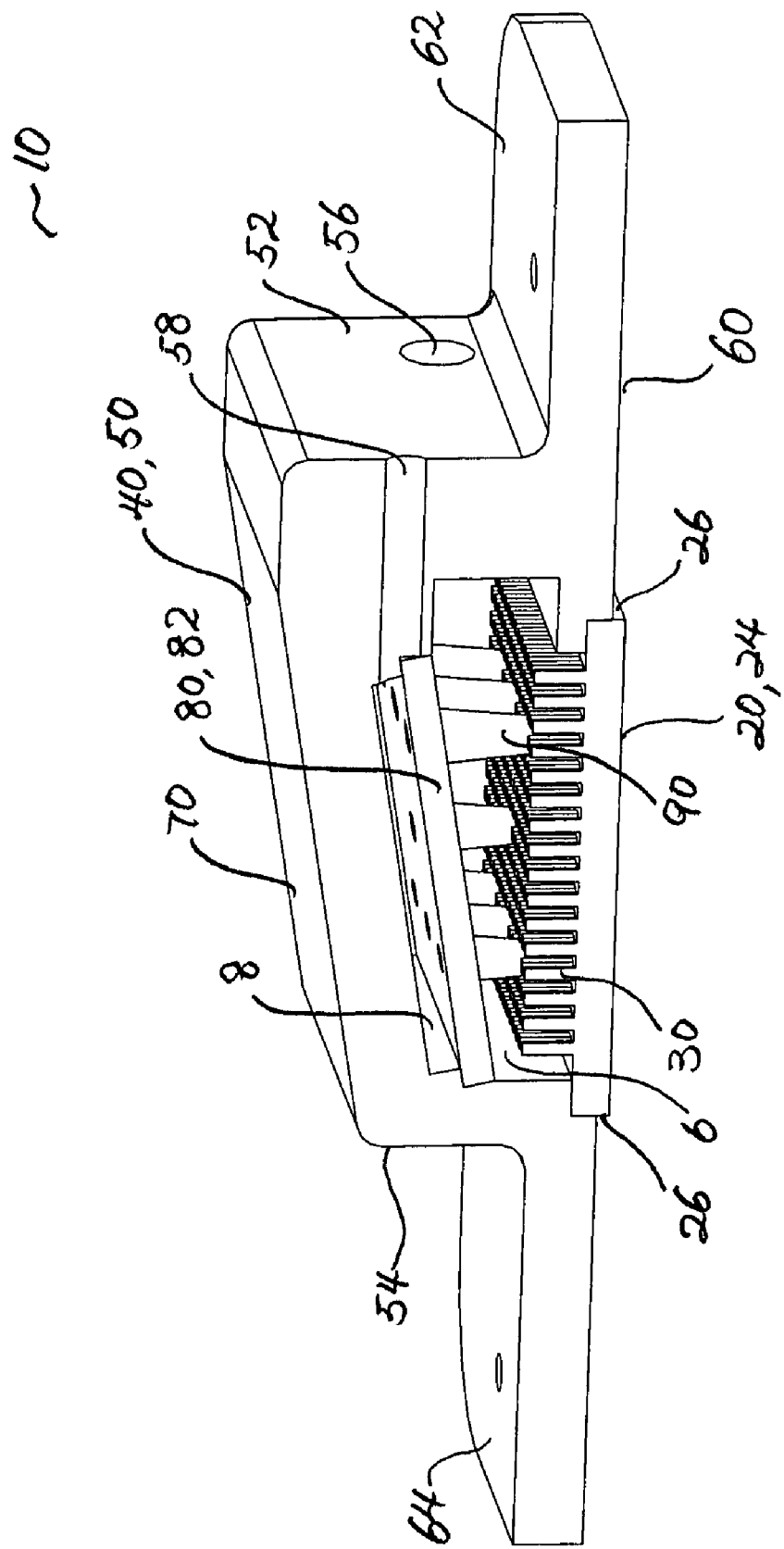
FIG. 4 is a perspective cut-out view of the phase-separated evaporator of FIG. 1, along line A-A of FIG. 2.

Referring to FIGS. 1 to 5, in one embodiment, phase-separated evaporator 10 comprises a boiler plate 20 and a phase separation chamber 40, as shown in FIGS. 3 and 4.

In the embodiment shown, boiler plate 20 has an upper surface 22, a bottom surface 24, and a plurality of pins 30 extending upward from upper surface 22. Preferably, upper surface 22 and pins 30 are coated with a micro porous coating material. Boiler plate 20 is made of a heat conductive material, preferably metal, for example, copper. For use with an existing CPU, a boiler plate can have a square shape with a dimension of about 40 cm (centimeter) by about 40 cm. The micro porous coating material coated area is about 30 cm by about 30 cm. In one embodiment, pins 30 have a square cross section, with a dimension of about 1 mm (millimeter) by 1 mm and a height about 4 mm. However, pins 30 can also have other geometries, such as rectangular, circular, or oval in the cross section. Furthermore, a boiler plate coated with the micro porous coating material, without pins, can also be used in the evaporator of the present invention.

Phase separation chamber 40 comprises a housing 50 and a phase partitioner 80. Housing 50 includes side walls 52, 54, 55a and 55b, a top wall 70 and a base 60 connected to periphery 26 of boiler plate 20. The top wall 70 inclines, from the first side wall 52 to the second side wall 54 along longitudinal axis 2, toward boiler plate 20. As shown in FIG. 3, the first side wall 52 extends beyond boiler plate 20 in the longitudinal direction, hence, phase separation chamber 40 has a longitudinally extended section 42, which provides an additional space for expansion of the vapor. Housing 50 has a gas port 56 and a liquid port 58 positioned on first side wall 52. In the configuration shown, base 60 has two anchoring flanges, 62 and 64, each having an aperture 66 for fastening the evaporator to the device which needs heat dissipation.

Housing 50 is made of a thermal-insulating material, which minimizes the conductive heat transfer from boiler plate 20 to housing 50, in turn, minimizes the conductive heat transfer from the evaporator to the connection conduits and the condenser used in a heat dissipation system. In this sense, housing 50 is also referred to as a decoupling chamber, as it thermally decouples the evaporator from the condenser. The terms decoupling and decouple used herein refer to the effect of inhibiting the conductive heat transfer from the base of the evaporator which can be in a direct contact with the heat source, such as the CPU of a computer, through the walls of the housing of the evaporator, to the condenser.

Furthermore, housing 50 insulates the heat inside the evaporator from the environment, which maximizes the heat carried out by the vapor. Suitable thermal-insulating materials include, but are not limited to, ceramic, thermoplastic, for example, epoxy plastic, diallyl phthalate, diallyl isophthalate, and phenolic resin. Preferably, housing 50 has an integral single piece structure, which can be produced by injection plastic molding.

In the embodiment shown, phase partitioner 80 includes a partition panel 82 and a plurality of feeding injectors 90 extending from lower surface 86 of partition panel 82 toward upper surface 22 of boiler plate 20. The periphery of phase partitioner 80 is hermetically connected to the interiors of the side walls of housing 50, which divides phase-separated evaporator 10 into a vapor directing compartment 6 and a condensate directing compartment 8. Partition panel 82 also inclines from the first side wall 52 to the second side wall 54 along longitudinal axis 2, toward boiler plate 20, and is substantially in parallel with, and adjacent to, top wall 70 of housing 50. To facilitate the positioning of partition panel 82 within housing 50, housing 50 can have a bossing around the interior of the side walls, so that partition panel 82 can be conveniently disposed against the bossing.

Figure 5:
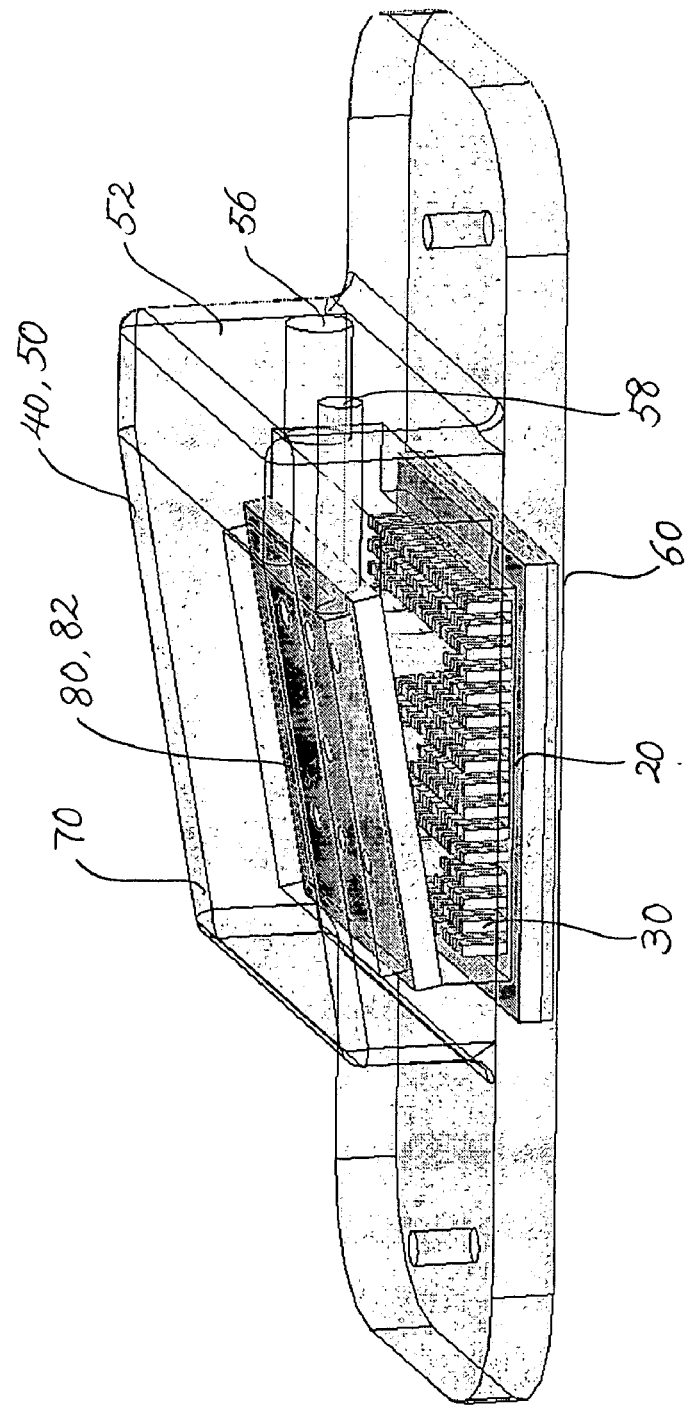
FIG. 5 is a see-through image view of the phase-separated evaporator shown in FIGS. 1 and 4.

As shown in FIGS. 3 thru 5, partition panel 82 separates gas port 56 and liquid port 58 into two compartments. Gas port 56 is in communication only with vapor directing compartment 6 and liquid port 58 is in communication only with condensate directing compartment 8. As shown in FIGS. 6 and 7, partition panel 82 further includes an opening 89 functioning as a pressure vent for balancing the pressure between vapor directing compartment 6 and condensate directing compartment 8. Preferably, opening 89 is positioned above the longitudinally extended section 42 beyond the nucleated boiling surface on which the evaporation of the coolant occurs, as described hereinafter.

Referring to FIGS. 6 thru 7 and 3, each feeding injector 90 has an injector inlet 92 communicating with upper surface 84 of partition panel 82 and an opposing injector tip 94. In the embodiment shown, feeding injector 90 tapers toward injector tip 94, with injector tip 94 disposed immediately above upper surface 22 of boiler plate 20. However, it should be understood that feeding injectors without tapering can also be used.

In one embodiment shown in FIG. 8, boiler plate 20 has a plurality of landing zones 28 on upper surface 22 among pins 30. In the embodiment shown, a landing zone 28 is located at a regular position of a pin within the array of pins 30, yet with a pin removed or not present at such a location. Feeding injectors 90 are disposed immediately above landing zones 28. With this configuration, there is a sufficient space for each injector tip 94 among pins 30, which ensures no physical contact between feeding injector 90 and adjacent pins 30. The surfaces of landing zones 28 are substantially free of micro porous coating material, and hence it reduces bubble formation at these locations, and provides effective receiving areas for the condensate.

Phase partitioner 80, inclusive feeding injectors 90, is made of a thermal-insulating material, which minimizes the conductive heat transfer through partition panel 82 between vapor directing compartment 6 and condensate directing compartment 8. Suitable thermal-insulating materials include those described above for housing 50.

Figure 9:
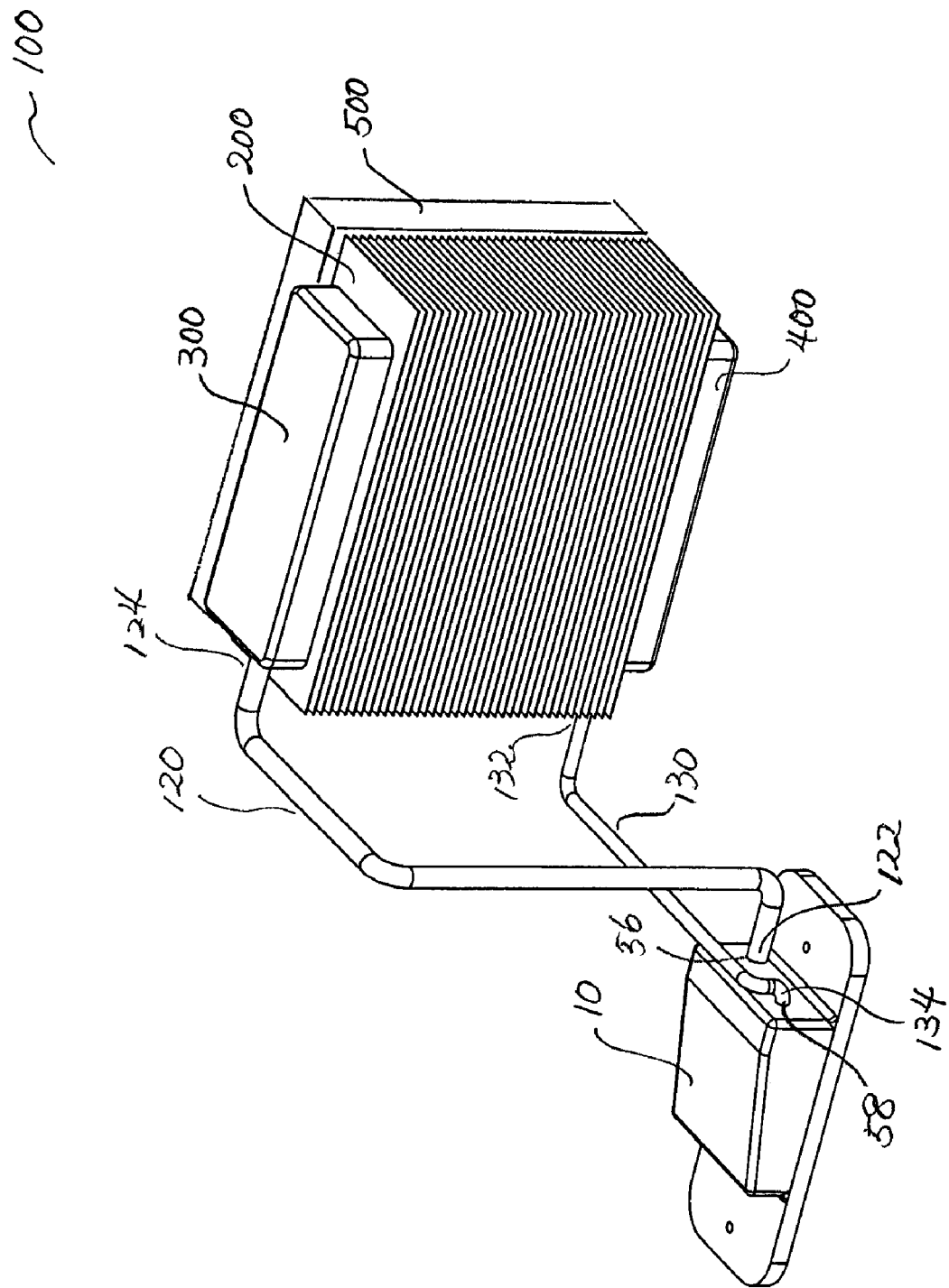
FIG. 9 is a perspective view of a heat dissipation system of one embodiment of the present invention.

In a further aspect, the present invention provides a heat dissipation system 100, which comprises phase-separated evaporator 10 of the present invention described above, a blade-thru condenser 200, and conduits connecting between the evaporator and the condenser, as shown in FIG. 9. The system includes a fan 500 positioned next to the condenser, which blows ambient air through the blades to remove the heat released from the condenser. Preferably, the condenser is a blade-thru condenser as described hereinafter. A blade-thru condenser has been described in detail in co-pending patent application Ser. No. 11/494,238, which is hereby incorporated by reference in its entirety.

However, the condenser can also be a conventional tube-and-blade condenser. It should be understood that the operational mechanism of the phase-separated evaporator of the present invention is independent of the structure of the condenser, although the performance of the heat dissipation system can be affected by the structure and cooling capacity of a specific condenser.

The heat dissipation system 100 further comprises an aqueous coolant. Suitable coolants include, but are not limited to, deionized water and refrigerant, such as refrigerant HFE7000 manufactured by 3M and Genetron® refrigerant 245FA manufactured by Honeywell.

Preferably, two separate conduits, a vapor conduit 120 and a condensate conduit 130 are used to connect phase-separated evaporator 10 and condenser 200. The first end 122 of vapor conduit 120 is connected to gas port 56 of phase separation chamber 40, the second end 124 of vapor conduit 120 is connected to an input interface of condenser 200. The first end 132 of condensate conduit 130 is connected to an output interface of condenser 200 and the second end 134 of condensate conduit 130 is connected to liquid port 58 of phase separation chamber 40. In the embodiment shown, vapor conduit 120 has a larger diameter for delivering gas.

Preferably, conduits 120 and 130 are made of flexible material, such as corrugated stainless steel tubing, copper alloy tubing, or other suitable materials, which provides the flexibility of positioning the condenser. Furthermore, the material used for the conduits is impermeable to the refrigerant, and is a poor heat conducting material. Corrugated stainless steel tubing possesses these preferred properties. Moreover, both conduits can be further thermally insulated from the ambient environment to reduce heat transfer between the conduits and the environment.

The operation of phase-separated evaporator 10 is described hereinafter in reference to a system environment. Referring now to FIGS. 3, 4 and 5, in operation a predetermined amount of an aqueous coolant, for example deionized water comprising a surface active agent, is placed into phase-separated evaporator 10 and the heat dissipation system is sealed under the vacuum. Phase-separated evaporator 10 is placed on a heat generating device that needs heat dissipation, with bottom surface 24 of boiler plate 20 in direct contact with a contact surface of the device, for example, placing bottom surface 24 of boiler plate 20 on top of the die face of a central processing unit (CPU) of a computer.

As the heat is transferred conductively through boiler plate 20, the coolant absorbs the heat and evaporates. This process occurs on top of the micro porous coating material coated on the upper surface 22 and pins 30, which is known as the nucleated boiling process, hence the coated surface is herein also referred to as the nucleated boiling surface. The vapor generated inside vapor directing compartment 6 exits from gas port 56, and enters into condenser 200 through vapor conduit 120. The vapor releases heat inside condenser 200, and is condensed into the liquid form inside the condenser. Then, the condensate returns back to phase-separated evaporator 10 through condensate conduit 130. The condensate enters from liquid port 58 into condensate directing compartment 8, therein it flows down on the inclined partition panel 82. The condensate enters feeding injectors 90, as driven by gravity, and injects from injector tips 94 onto landing zones 28 on boiler plate 20. From the landing zones, the condensate diffuses on the nucleated boiling surface by a capillary effect of the micro porous coating material, and thereon absorbs heat and evaporates again. As such, the evaporation and condensation processes repeatedly continue within the heat dissipation system, which effectively remove heat from the heat generating device to a surrounding environment.

With regard to the feeding of the condensate from injector tips 94 to landing zones, in addition to the gravity drive, it is believed that there may be a localized differential pressure at the landing zones, which may further facilitate feeding of the condensate. In the process of nucleated boiling, when a bubble leaves the pin immediately adjacent to a landing zone, a localized vacuum is formed as the condensate rushes in to replace the space of the bubble. This continuous liquid to gas conversion and liquid replacement may cause a localized differential pressure around the landing zone, which may have an inductive effect to the feeding of condensate from an injector tip.

As described above, phase-separated evaporator 10 of the present invention separates vapor and condensate into two compartments within the evaporator. This profoundly enhances the efficiency of the evaporator. In the phase-separated evaporator, when the vapor exits from the evaporator, it is guided by vapor directing compartment 6, without any physical contact with the returning condensate; therefore, the vapor remains at its high temperature and effectively carries heat into the condenser. Furthermore, by separating the condensate from the vapor, the exit of the vapor is not impeded by the counter flow turbulence caused by the returning condensate. On the other hand, as the condensate enters the evaporator, it is guided by condensate directing compartment 8, without any physical contact with the rising vapor; therefore, the condensate remains at its low temperature when it is injected onto the boiler plate. Consequently, the phase-separated evaporator of the present invention generates higher temperature vapor as it leaves the evaporator and maintains lower temperature condensate as it reaches the boiler plate in comparison to the traditional evaporator. In other words, the phase-separated evaporator maximizes the temperature difference (ΔT) between the out-bound vapor and the in-bound condensate. It can be understood that the lower the temperature of the condensate is, the faster the conductive heat transfers from the boiler plate to the condensate, and more heat is absorbed in the process of evaporation.

As well known in traditional evaporators, which only have one chamber or compartment above the boiler plate, the rising vapor encounters the returning condensate, and premature condensation of the vapor occurs before it exits from the evaporator. On the other hand, prior to the condensate reaches the boiler plate, the condensate is already heated up by the vapor. Herein, the term "premature condensation" refers to condensation of the vapor prior to the vapor entering into the condenser. It can be appreciated that using the phase-separated evaporator of the present invention, without physical contact with the in-bound condensate, the premature condensation of the out-bound vapor within the evaporator is minimized. This maximizes the amount of heat carried by the vapor out of the evaporator.

Furthermore, the space between top wall 70 and partition panel 82 is very limited, and the condensate does not accumulate within this space. Hence, the condensate has very short retention time within condensate directing compartment 8 before being delivered to boiler plate 20. This reduces heating of the condensate by conductive heat transfer.

To further minimize the retention time of the condensate in condensate directing compartment 8, partition panel 82 can further include several condensate grooves (not shown) on upper surface 84, connecting inlets 92 of feeding injectors 90 in the longitudinal direction. The condensate grooves can start immediately next to liquid port 58, and end at the lower edge of the inlet 92 of the feeding injector 90 nearest to the second side wall 54. The condensate grooves further guide the condensate into feeding injectors 90, and minimize the retention of condensate in the area around inlets 92. It should be understood that other suitable configurations or arrangement to facilitate the delivery of condensate into the feeding injectors can also be used for the purpose of the present invention.

To facilitate efficient delivery of the condensate to the boiler plate, injector tip 94 can have a meniscus cross section. Because of the minimum distance between injector tip 94 and upper surface 22 of boiler plate 20, for example 0.25 mm, the meniscus shape eases the flow of the condensate, and also minimizes disruption of the flow from the bubbles generated by the nucleated boiling.

Figure 10:
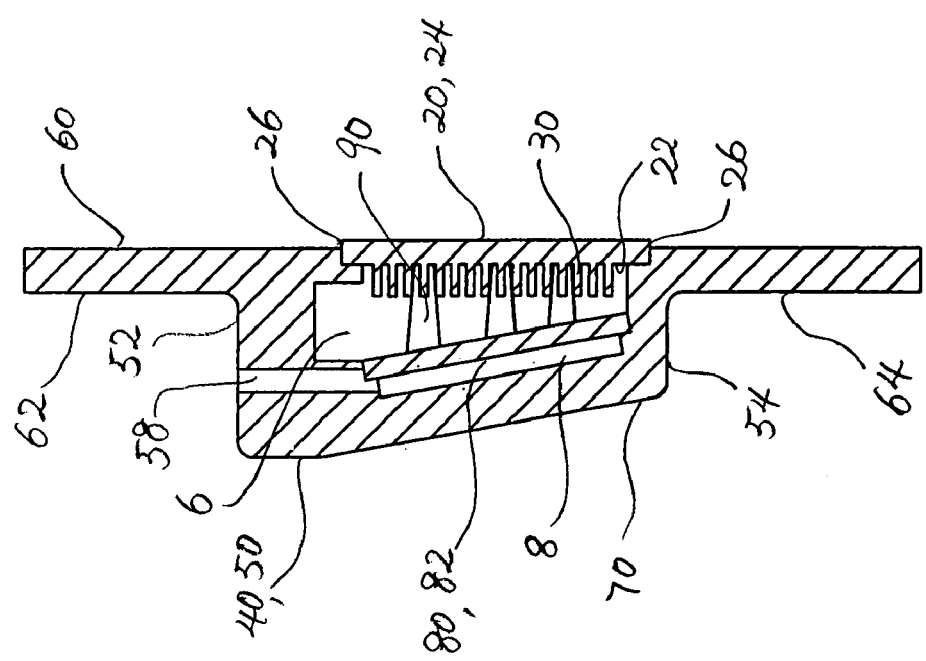
FIG. 10 is a cross-sectional view showing the phase-separated evaporator of FIG. 3 positioned with a 90 degree rotation.

As shown in FIG. 10, the phase-separated evaporator shown in FIGS. 1-5 can also be used with boiler plate 20 in a vertical orientation. With certain computer configurations, the contact surface of the CPU is in a vertical position, which requires a vertical interface with the heat dissipation device. As shown in FIG. 10, the functions of phase-separated evaporator 10 are maintained in this orientation. The condensate flows down along the top wall 70 of housing 50 and injects onto boiler plate 20 in a horizontal direction as guided by feeding injectors 90.

In a further embodiment, feeding injectors 90 of partition panel 82 may have different inner diameters, depending on the locations of the feeding injectors. For example, for the vertical orientation of the phase-separated evaporator, the feeding injectors in a higher position, or more adjacent to the first side wall 52, have a larger inner diameter; and the inner diameter of the feeding injectors reduces gradually in a downward direction, or more closed to the second side wall 54. Such a gradual reduction of the inner diameter of the feeding injectors assists in controlling the condensate flow when it is delivered to upper surface 22 of boiler plate 20 to obtain more even distribution of the condensate.

Figure 11:
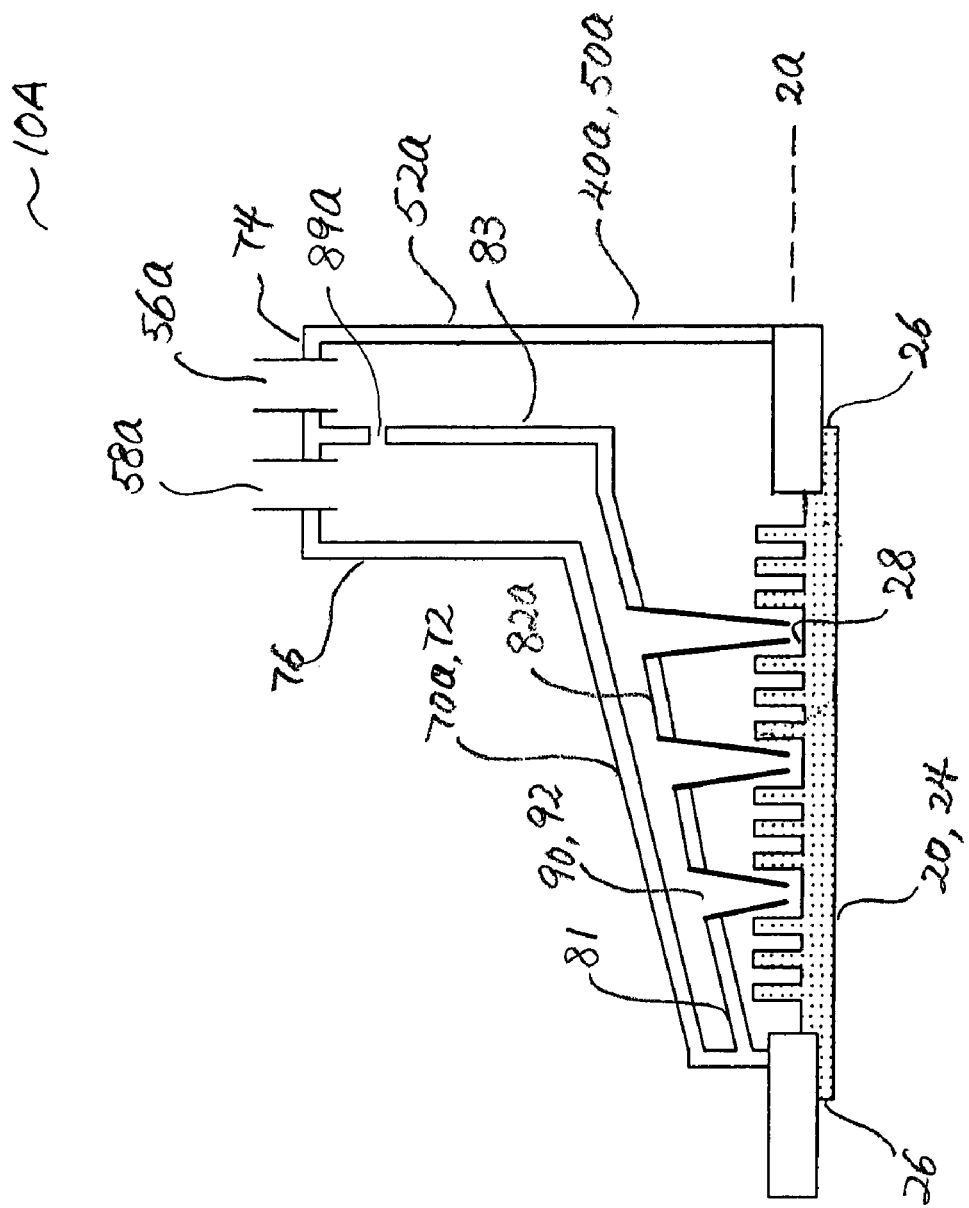
FIG. 11 is a cross-sectional view of the phase-separated evaporator of a further embodiment of the present invention.

Depending on the arrangement between the phase-separated evaporator and the condenser of the heat dissipation system, the phase-separated evaporator can be configured differently. In an alternative embodiment, a phase-separated evaporator 10A is provided as shown in FIG. 11. In this configuration, top wall 70a of housing 50a has two sections, an inclined section 72, which covers substantially upper surface 22 of boiler plate 20 along longitudinal axis 2a, and a port section 74, which is next to, and vertically extending above, inclined section 72. The port section 74 has a connection wall 76 on one side, which connects with inclined section 72. On the other side, the first side wall 52a of housing 50a extends into the portion section 74, which is substantially in parallel with connection wall 76, forming a chimney-like structure. Liquid port 58a and gas port 56a are positioned on top of port section 74 of top wall 70a. To provide phase separation within phase separation chamber 40a, partition panel 82a includes an inclined panel 81 substantially in parallel with inclined section 72 of top wall 70a and a vertical section 83 extending from inclined panel 81 upwardly between connection wall 76 and first side wall 52a. The structure and orientation of feeding injectors 90 are the same as described above in the phase separation chamber 40. The opening 89a, or pressure vent, is positioned on vertical section 83 of partition panel 82a between condensate directing compartment and the vapor directing compartment. With this configuration, liquid port 58a and gas port 56a, positioned on top wall 70a, can be connected to the condenser by the vapor and condensate conduits, or can directly interface with the inlet and the outlet of a condenser disposed above port section 74.

Furthermore, the phase-separated evaporator 10A can also be orientated with boiler plate 20 in the vertical position, in the same manner shown in FIG. 10 of the evaporator 10. In this orientation, the section of the condensate directing compartment between connection wall 76 and vertical section 83 of partition panel 82a can also function as a condensate reservoir.

The phase-separated evaporator of the present invention has made a revolutionary breakthrough in the structure of an evaporator. It has abandoned the conventional single chamber structure, and for the first time, introduces phase separation within the evaporator to direct the returned condensate directly onto the boiler plate without encountering the exiting vapor. The efficiency enhancement achieved by the instant phase-separated evaporator contributes to the record-breaking heat dissipation efficiency of the heat dissipation system of the present invention as illustrated hereinafter in the example.

As stated above, in a preferred embodiment the heat dissipation system of the present invention includes a blade-thru condenser. The structure and operation mechanism of the blade-thru condenser are described hereinafter.

Referring now to FIGS. 9, 12 and 13 thru 13B, in one embodiment blade-thru condenser 200 comprises a condenser core 220, a vapor input interface in the form of input manifold 300, and a condensate output interface in the form of output manifold 400.

Condenser core 220 comprises a plurality of layers of blades 230 joined one on top of another along a longitudinal axis 212 of condenser 200 by joint interfaces 240 formed between two adjacent blades. Each layer of blades 230 has multiple chambers 250, herein also referred to as condensation chambers. In the embodiment shown, condensation chambers 250 are drawn chambers, which are formed monolithically in each blade. On floor 252 of each condensation chamber 250 there can be one or more apertures, or openings, 260, which permit vapor and condensate to pass therethrough and cause vibration of floor 252 of condensation chamber 250. As shown, a plurality of layers of blades 230 are so aligned that floors 252 of condensation chambers 250 of each layer of blade 230 are on top of walls 256 of condensation chambers 250 of blade 230 immediately underneath, thereby forming multiple phase exchange columns 280 in parallel to longitudinal axis 212. In the embodiment shown, each blade 230 of condenser core 220 includes three condensation chambers. However, the number of condensation chambers can vary depending on the desired capacity and/or size of the condenser. For example, in a low capacity condenser, each blade can have only one or two condenser chambers, and the condenser core has only one or two phase exchange columns.

Blades 230 are made of heat conducting materials, preferably metal, such as copper or aluminum. In an exemplary embodiment, blade 230 is made of a copper blank. As shown, blades 230 are substantially planar except the areas having the drawn chambers. Between each two adjacent blades 230, there is a sufficient distance for dissipating heat released from the blades by convection driven by ambient air flow. In the exemplary embodiment described above, the distance between two adjacent blades is about 1.5 mm.

To construct condenser core 220, multiple drawn chambers 250 (three are shown in FIG. 12) are formed monolithically in each blade 230. Two apertures, 270 and 274, are fabricated on floor 252 of each drawn chamber 250. The cross sectional profile of a lower portion of wall 256 of each drawn chamber 250 is configured to interlock with a top portion 254 of the wall of drawn chamber 250 of the immediately underlying blade. FIG. 13A shows detailed structure of a joint interface 240 between two immediately adjacent blades 230 of one embodiment of the present invention, which can be jointed together by soldering, adhesive, or other suitable means. As shown, top portion 254 of wall 256 is a small planar recess, which provides a seating rim to the condensation chamber 250 of the blade immediately above.

It should be understood that in a preferred embodiment each blade 230 has a monolithic structure. Each drawn chamber 250 is an integral part of blade 230, and there is no interface of different materials between drawn chamber 250 and the rest of blade 230. This monolithic structure eliminates the metal to metal interfaces between a tubular core and separate fins affixed thereto by soldering or brazing, which are the interface structures used in most conventional condensers, radiators and heat exchangers. These metal to metal interfaces have intrinsically a significant thermal resistance, and therefore, seriously hinder the heat transfer from the tubular core to the fins.

Therefore, it can be understood that the term "blade-thru" used herein refers to a structural feature wherein a monolithic blade forms part of the chamber where the phase exchange of vapor occurs, and the exterior fin. In the condenser so structured, along each layer of blade there is no interface between different materials at the transition point between the fin and the condensation chamber which, in function, corresponds to part of the conventional tubular core. Therefore, there is no hindrance to heat transfer from the floor of the condensation chamber to the fin.

In one exemplary embodiment as shown in FIGS. 12 thru 13B, condenser core 220 comprises about 40 planar blades 230, interconnected together as described above. In the embodiment shown, condensation chamber 250 has a circular shape with a diameter about 12 mm. In this structure, apertures 260 include an orifice 270 on one side of floor 252, and a semispherical aperture 274 on the other side of floor 252. The semispherical aperture 274 can be produced by partial piercing, which forms a reed flap 272. It noted that reed flap 272 is part of semispherical aperture 274, and in the context herein when the term of semispherical aperture 274 is used it refers to the aperture inclusive of the reed flap. In the structure shown, orifice 270 is circular. In one embodiment, orifice 270 has a diameter of 3 mm and semispherical aperture 274 has a height about 0.4 mm at the center of the aperture. However, orifice 270 can also have other shapes or geometries, such as elliptical, square, rectangular, triangle, elongated slot, etc. Similarly, semispherical aperture 274 can also have various other shapes and geometries; for example, an alternative aperture having a reed can be produced by a knife edge formed by a narrow slot cut, or other such cuts that produce a reed which can vibrate in a passage of vapor flow. Furthermore, the reed flap can have a different thickness between the edge portion and root portion that is adjacent to the wall of the chamber, and typically, the edge portion is thinner. In operation, the thinner the edge portion is, the lower the vapor pressure that triggers the vibration. Moreover, the temper, or hardness, of the metal also contributes to the triggering threshold of the vibration and the frequency of the vibration.

In the working environment of the blade-thru condenser of the present invention, orifice 270 and semispherical aperture 274 are vibratory openings, which vibrate when vapor passes through the apertures. In the hermetically sealed condenser 200, which is connected to evaporator 10 by conduits, as vapor enters a phase exchange column from the upper end of the condenser core, it travels down the column by passing through orifice 270 and semispherical aperture 274 in every condensation chamber. The vapor flow, more specifically, the pressure difference between the upper and lower sides of the floor of the condensation chamber, induces vibration of the floor.

Between orifice 270 and semispherical aperture 274, the vibration of semispherical aperture 274 can be initiated at a lower vapor pressure, or a lower pressure difference between the upper and lower sides of the floor. This can be appreciated by the fact that a much lower pressure difference, which is also referred to as differential pressure, can cause vibration of reed flap 272, hence, induce the vibration of the floor. The vibrations of orifice 270 and semispherical aperture 274 are both in multiple frequencies, yet can be in different frequency ranges. When both orifice 270 and semispherical aperture 274 are present on the floor of condensation chamber 250, as shown in FIGS. 12 and 13, the vibration can be initiated by different vapor pressures, or pressure differences, and the vibration frequencies also have a broader spectrum. This results in an enhancement of heat exchange efficiency of the condenser, as further described hereinafter. Moreover, it can be appreciated that the vibration of the condensation chambers might cause the vapor to pass the apertures in an oscillatory manner, which in turn, could further enhance the vibration of the floors. It should be understood that combinations of other suitable aperture structures or configurations can also be used to achieve the same effect.

Therefore, the term of vibratory opening or aperture used herein refers to one or more apertures on a thin blade, which vibrates when exposed to a passage of vapor flow or a differential pressure. This is similar to the working mechanism of a Helmholtz resonator.

Further details of the structure and operation of condenser 220 are described hereinafter in reference of FIGS. 12 and 13. As shown, within one phase exchange column 280, the first blade 230 from the upper end of condenser core 220 has its orifice 270 aligned near semispherical aperture 274 of the second blade 230, and its semispherical aperture 274 aligned near orifice 270 of the second blade 230. In this sense, orifices 270 and semispherical apertures 274 of two immediately adjacent blades 230 are misaligned. However, orifices 270 and semispherical apertures 274 of every alternate layer of blades are in alignment, therefore, the positioning of orifices 270 and semispherical apertures 274 is bilaterally symmetric.

As vapor enters each phase exchange column from input manifold 300, it passes through orifices 270 and semispherical apertures 274 forming a vapor column, which causes vibration of floor 252 of each condensation chamber 250. Furthermore, as can be visualized in FIG. 13, with the bilaterally symmetric arrangement within each phase exchange column 280, the vapor travels down with a zig-zag pathway through orifices 270 and semispherical apertures 274, which forces the vapor to have a maximum contact with the metal surface, and hence to achieve a maximum heat exchange between the vapor and the metal. On the other hand, the angle of reed flap 272 also facilitates the condensate to flow down through semispherical apertures 274 within the column. It should be understood, however, that the bilaterally symmetric arrangement is only one of possible arrangement of the vibratory apertures, and various other structures and arrangements of the vibratory apertures can be used for the purpose of the present invention.

In the process of continuous heat exchange inside the condenser, the condensate formed in each condensation chamber flows down within columns 280. The vibration of the chamber floor reduces retention of the condensate within the condenser chamber. Furthermore, it is known that the liquid film temporarily formed by the condensate on the metal surface insulates the metal from a direct contact with the vapor, which slows down the rate of heat exchange between the vapor and the metal, therefore, could reduce the heat exchange efficiency of the condenser. With the structure and the operation mechanism of condenser core 220 of the present invention, this film effect has been substantially reduced by the vibration of the floor induced by the vibratory apertures in each condensation chamber, as described above. The vibration reduces the liquid film formation and retention on the surface of condenser chamber, and hence, reduces the loss of heat exchange efficiency caused by this film.

Moreover, it can be further appreciated when the metal vibrates within the flow of the vapor, the effective surface contact between the higher temperature vapor to the lower temperature metal is maximized. Therefore, vibration of the metal increases the heat transfer from the vapor to the metal beyond the heat transfer that occurs in a static environment, because of the increased effective surface contact between the metal and the surrounding column of vapor.

As described above, the condenser core of the present invention utilizes the monolithic and integral blade-thru structure and preferably vibratory effect to substantially enhance heat exchange efficiency, it is hence, also referred to as a blade-thru Helmholtz condenser.

Fan 500 is positioned adjacent to condenser core 220, which blows air through condenser core 220 in a direction transverse to the longitudinal axis 212 of condenser core 220, to dissipate heat released inside condenser core 220 into the surrounding environment.

As shown in FIGS. 9 and 14 thru 14B, in one embodiment input manifold 300 is in a form of a chamber, having a case 310 and a base 320. Case 310 has a vapor inlet 312 to which the second end 124 of vapor conduit 120 is connected. There are multiple vapor outlets 330*a*, 330*b* and 330*c* on base 320. As shown in FIG. 9, input manifold 300 is disposed on top of condenser core 220, wherein each vapor outlet is positioned directly above a condensation chamber 250 on the first blade 230 of condenser core 220, for directing vapor into one column of condensation chambers 250 within condenser core 220. As shown in FIGS. 14A and 14B, vapor outlets 330*a*, 330*b* and 330*c* have different diameters. The diameter of the vapor outlet increases with the distance of the outlet from vapor inlet 312, which compensates the pressure difference due to the distance from vapor inlet 312, and balances the amount of vapor entering into the three columns of condensation chambers 250.

As shown in FIGS. 15 and 15A, output manifold 400 has a similar, yet reversed structure of the input manifold 300, wherein case 410 faces up and the lowest blade 230 is disposed on a top panel 420. Output manifold 400 has multiple condensate inlets 430 on top panel 420. Each condensate inlet 430 is positioned directly underneath one condensation chamber 250 of the lowest blade 230 of condenser core 220. As shown in FIG. 15, a spacer ring 580 is positioned on the top panel 420 around each condensate inlet 430. Different from the vapor inlets of the input manifold, condensate inlets 430 can have the same diameter, because at this location the vapor has completely condensed and no pressure difference needs to be compensated. Output manifold 400 has a condensate outlet 440 to which the first end 132 of condensate conduit 130 is connected.

Input manifold 300 and output manifold 400 are preferably made of a thermal-insulating material. The materials described above for housing 50 of evaporator 10 can be used for making Input manifold 300 and output manifold 400. In one exemplary embodiment, LE grade Garolite sheet from McMaster Carr, Atlanta, Ga. is used. This material is composed of several layers of fine weave cotton fabric that is compressed, heated and cured in phenolic resin.

Figure 16A:
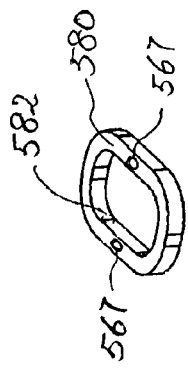
FIG. 16A is a perspective view of a spacer ring of the condenser core of FIG. 16.
Figure 16B:
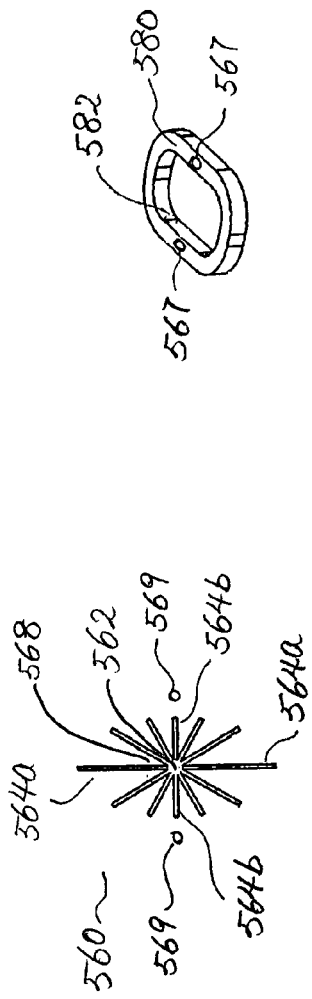
FIG. 16B is an enlarged top view of the aperture on the floor of the condensation chamber on a blade of the condenser core shown in FIG. 16.
Figure 16:
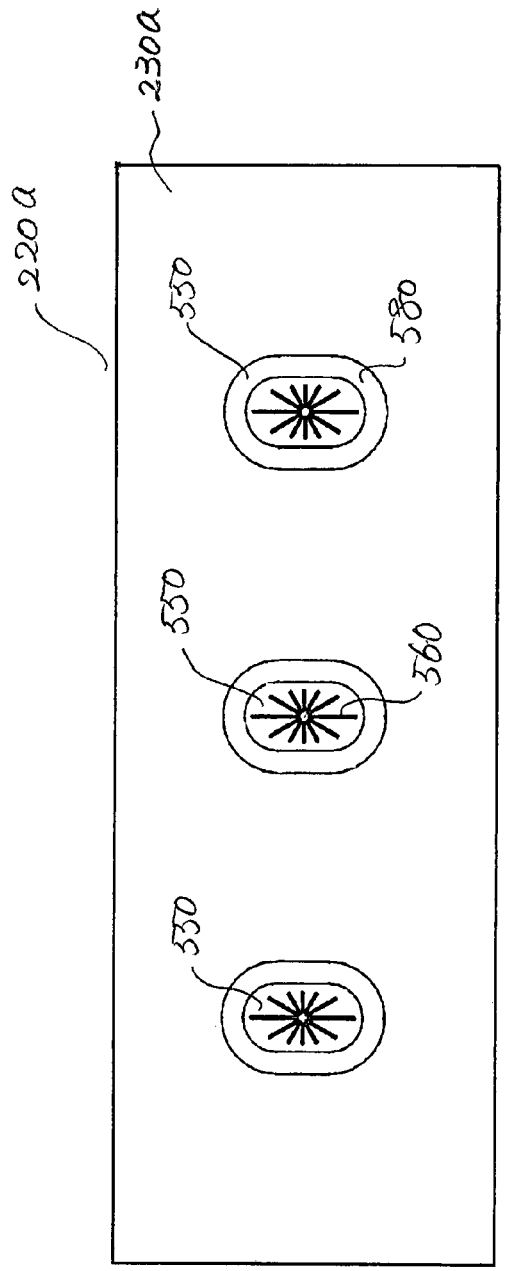
FIG. 16 is a top view of the condenser core of the blade-thru condenser of a further embodiment of the present invention.
Figure 17:
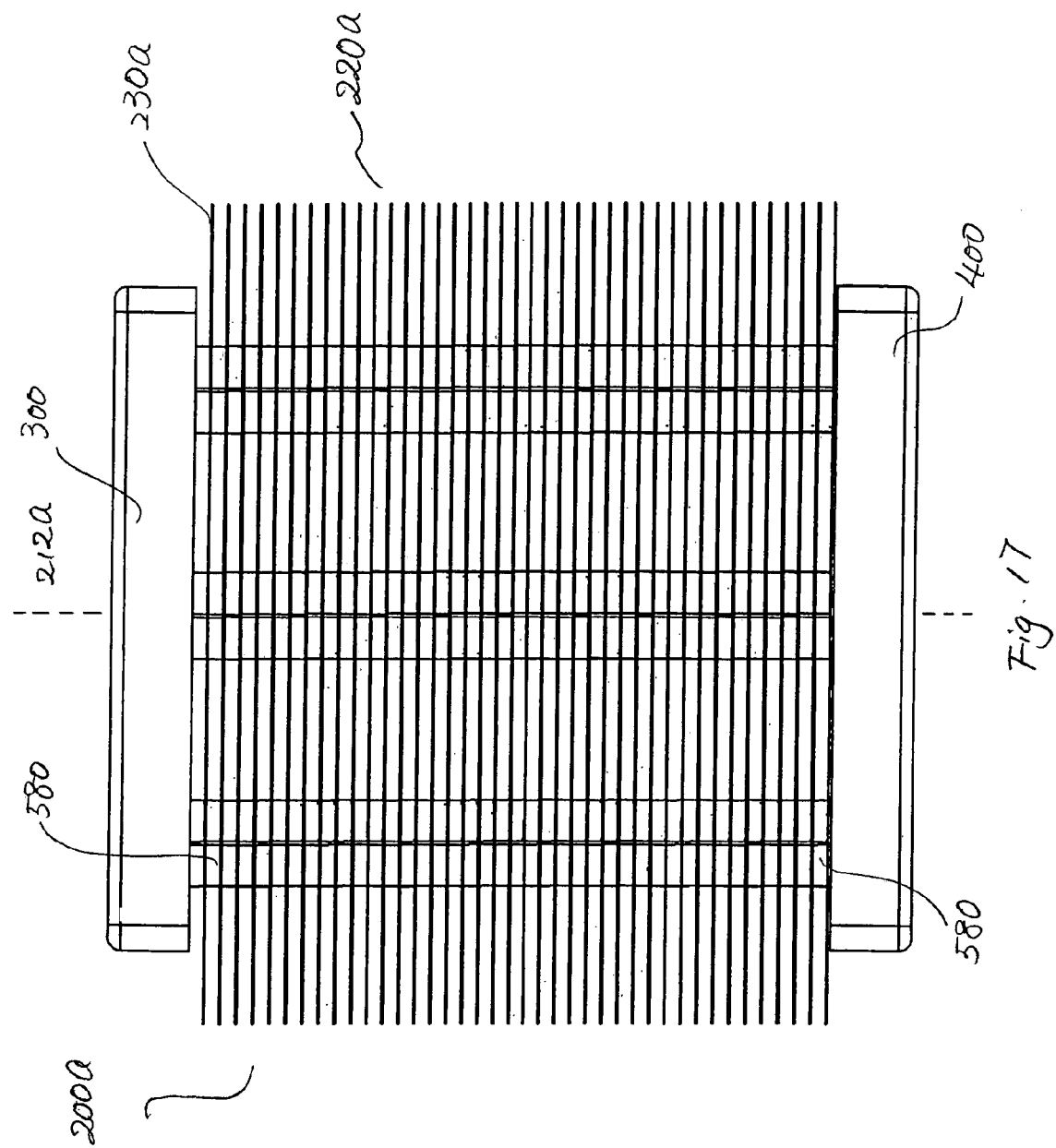
FIG. 17 is a side view of a blade-thru condenser of one embodiment of the present invention.

FIGS. 16 thru 17 show condenser core 220*a* of condenser 200*a* of a further embodiment of the present invention, which has a different condensation chamber structure and interface between adjacent blades. Condenser 200*a* can have the same input manifold 300 and output manifold 400 described above. FIG. 16 shows a top view of condenser core 220*a*. In this embodiment, blade 230*a* is planar, and condensation chamber 550 is formed by placing a spacer ring 580 around a radially extended multi-slot aperture 560. As shown in FIG. 16A, spacer ring 580 has a height 582, which separates two adjacent blades 230*a*. The condenser core 220*a* is formed with a plurality of blades 230*a* stacking one on top another along the longitudinal axis 212*a*, with spacer rings 580 in-between each two adjacent blades 230*a*, as shown in FIG. 17.

Spacer ring 580 can be attached to blade 230*a* by soldering, or by other suitable means. In one embodiment, spacer ring 580 is made of stainless steel, which is a poor heat conductive material in comparison to copper. Therefore, the heat transfer by conduction between adjacent blades, other than by vapor, is reduced. This further enhances the temperature difference between the top of condenser core 220*a* where the vapor enters, and the bottom of condenser core 220*a* where the condensate exits the condenser. Consequently, the condensate produced has a low temperature, which is not prematurely heated within the condenser by conductive heat transfer between the blades through the space rings.

As shown in the enlarged view of FIG. 16B, multi-slot aperture 560 has multiple slots 564 extending radially from a center aperture 562. In this configuration, there are no separate orifice and semispherical aperture as described above. Instead, the radially extended multi-slot aperture 560 provides the passages for both vapor and the condensate, and functions as a multi-frequency resonator, as further described below. In condensation chamber 550, the condensate flows down through the ends of slots 564 near spacer ring 580, while the vapor passes through center aperture 562 and the ends of slots 564 near center aperture 562.

As shown, multiple slots 564 have different lengths, for example, the pair of opposing slots 564*a* is the longest and the pair of opposing slots 564*b* is the shortest. This forms multiple different reeds. Because of the length difference in the slots, one reed 568 formed between two adjacent slots can have a different triggering threshold for vibration or resonance in the pressurized vapor from the triggering thresholds of other reeds. Some reeds start to vibrate at a lower vapor pressure, and others start to vibrate at a higher vapor pressure. With this configuration, the vibration can be induced even under a relatively low vapor pressure, such as under a condition where the heat generating device has not reached very high temperature. This mechanism broadens the effective operating range for initiating vibration, which, in turn, enhances the efficiency of the condenser when the heat generating device has yet reached an undesirable high temperature.

It should be understood that other suitable structures or configurations of the condensation chamber and the apertures on the blades, which enable vibration in the presence of the vapor flow, can also be used for the purpose of the present invention.

The operation mechanisms of the phase-separated evaporator and the blade-thru condenser have been individually described above. The operation of the heat dissipation system 100 of the present invention is briefly described below from the perspective of the whole system.

Vacuum is applied to heat dissipation system 100 to remove air, then a predetermined amount of a coolant is placed into the phase-separated evaporator 10 under vacuum, and the system is sealed. It is noted that all connections between the evaporator and the conduits, and between the condenser and the conduits are air and liquid tight. In operation, when the refrigerants described above are used, they evaporate at a temperature about 30° C., and the vapor pressure in evaporator 10 can be from about 10 psi to about 25 psi.

In general, the bottom surface 24 of boiler plate 20 is placed in direct contact with a contact surface of a heating generating device, for example, attached to the die face of a CPU of a computer's motherboard for dissipating heat generated at the CPU. In operation, as the heat is transferred conductively from the CPU, or other heat generating devices, to boiler plate 20, nucleated boiling occurs on top of the micro porous upper surface 22 and pins 30. The coolant absorbs heat, evaporates, and exits from the vapor directing compartment 6. The vapor travels through vapor conduit 120, enters input manifold 300, and then enters phase exchange columns 280 of condenser core 220. As described above, the high temperature and high pressure vapor passes through apertures of condensation chambers 250, travels down in phase exchange columns 280. Upon contacting with the blades, the vapor releases heat and converts back into liquid condensate within phase exchange columns 280. In this process, the vapor passes through the apertures and causes vibration of the floor, which further increases the heat exchange efficiency as described above. The condensate formed exits from output manifold 400, flows through condensate conduit 130, and then enters liquid port 58 of condensate directing compartment 8 of phase-separated evaporator 10. The condensate fills into the plurality of feeding injectors 90, and dispenses onto the landing zones 28. The condensate diffuses on the nucleated boiling surface of the boiler plate, which is then heated up again by the heat absorbed from the CPU, and is converted into vapor again.

As such, the evaporation and condensation processes continue repetitively within heat dissipation system 100, and the phase change from the liquid form to the gas form and from the gas form back to the liquid form effectively removes heat from the CPU, or other heat generating devices, to a surrounding environment.

Using two separate conduits in heat dissipation system 100 substantially reduces heat exchange between the vapor and the condensate during their traveling between the evaporator and the condenser. As the vapor leaves the evaporator, it enters vapor conduit 120 without physical contact with the returning condensate; therefore, the vapor remains at its high temperature and effectively carries heat into the condenser. On the other hand, as the condensate exits the condenser, it does not contact the rising vapor; therefore, the condensate remains at its low temperature when it returns back into the evaporator. Moreover, preferably, both vapor conduit 120 and condensate conduit 130 are thermally insulated from the ambient environment. Thermal insulation reduces heat exchange between the vapor inside the vapor conduit and the environment, and therefore, maximizes the heat carried by the vapor into the condenser. Similarly, thermal insulation also reduces heat exchange between the condensate and the environment, which minimizes premature heating of condensate by the environment and maintains the condensate at, a low temperature as it enters the evaporator.

An unprecedented heat dissipation efficiency has been observed using the instant heat dissipation system. As illustrated in the example below, using the heat dissipation system of the present invention, the temperature of a simulated die face of CPU was maintained below 55° C. with an input power of 330W for simulating heat generation. In comparison, when an existing commercial ThermalRight XP90C 4-tube heat pipe was used as the heat dissipation device, the temperature of the same die face was already about 60° C. when the input power was only 170W.

Figure 19A:
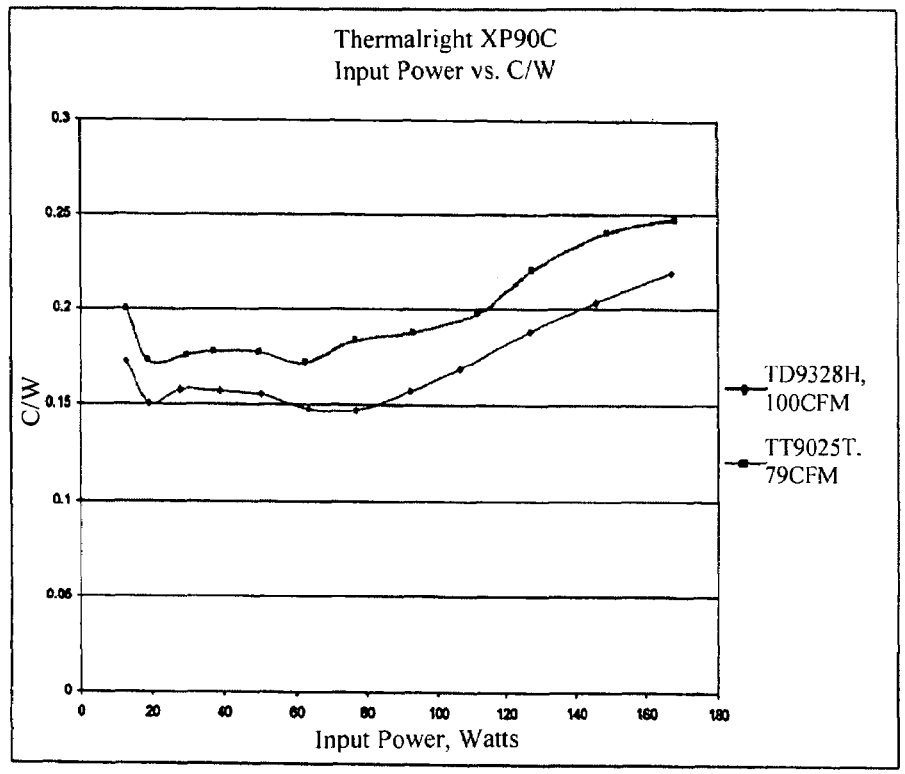
FIGS. 19A and 19B are the test results of the performance of an existing heat pipe.
Figure 19B:
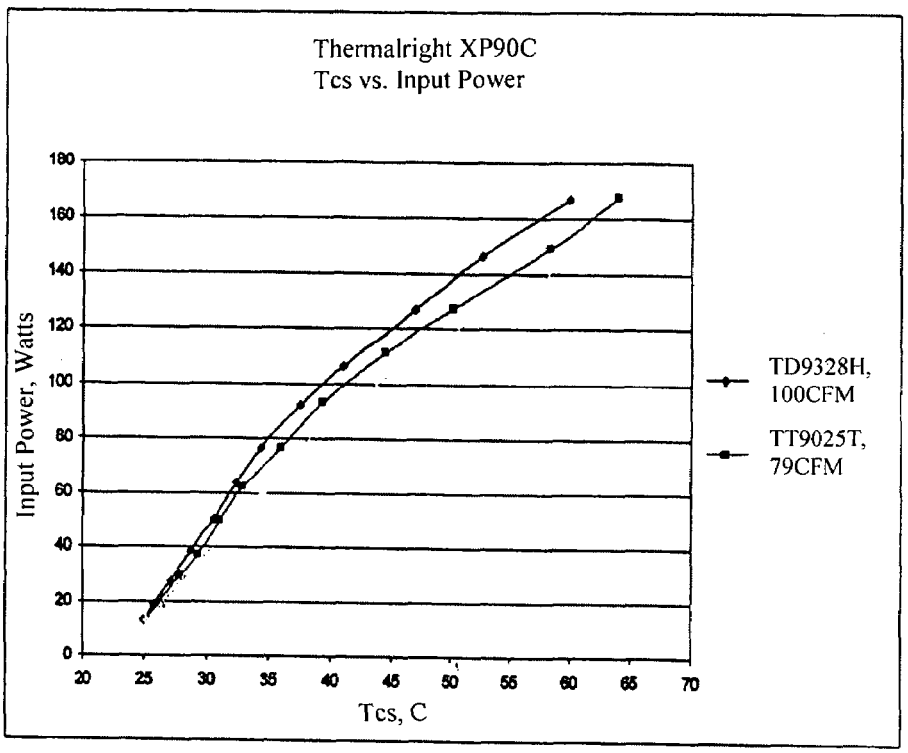
Figure 20A:
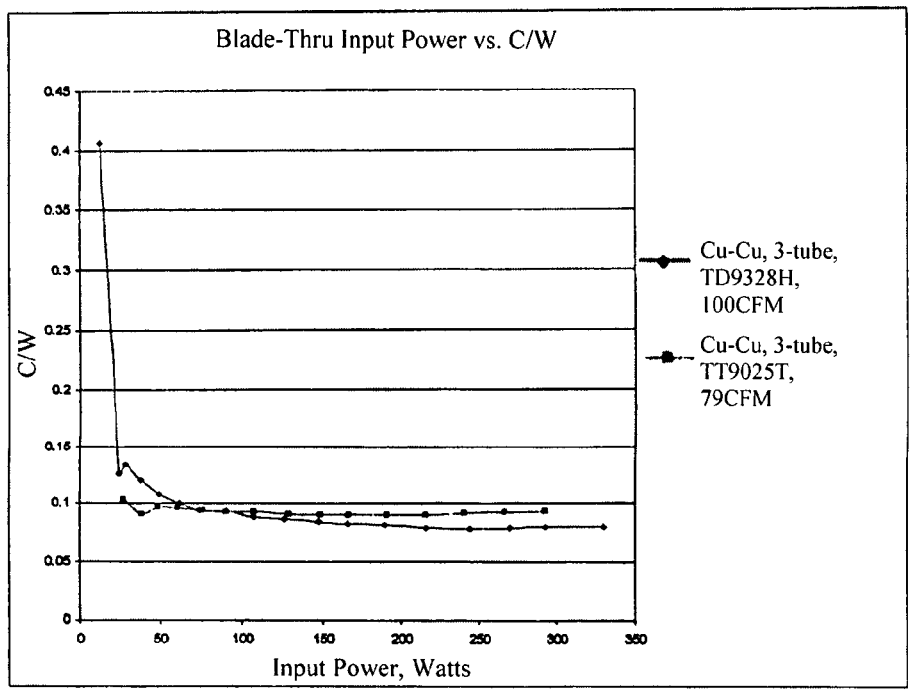
FIGS. 20A and 20B are the test results of the performance of the heat dissipation system of the present invention.

As further shown in FIGS. 19A and 20A, when expressed with the heat resistance $\theta cs$ (C/W), using the instant heat dissipation system the heat resistance of the simulated die face of CPU was about 0.08 (CAN) when the input power was about 330W, while using ThermalRight XP90C, the heat resistance of the simulated die face of CPU was about 0.22 (CAN) when the input power was about 170W. It is noted that the lower the heat resistance of the die face of the CPU, the more effective the heat dissipation device is.

Currently, the lowest heat resistance achieved by the existing heat dissipation devices known in the art is about 0.12 (C/W). Therefore, the heat dissipation system of the present invention has made a revolutionary breakthrough in terms of efficiency and capacity in heat dissipation.

EXAMPLE

A prototype heat dissipation system was built, which included a phase-separated evaporator, illustratively shown in FIG. 11, a blade-thru condenser comprising condenser core 220a (as illustrated in FIGS. 16-17), a condensate conduit, and a vapor conduit.

In the phase-separated evaporator, the boiler plate had a square shape with a dimension of about 40 cm by about 40 cm. The micro porous coating material coated area is about 30 cm by about 30 cm. The boiler plate had a matrix of 256 pins formed with 16 rows by 16 column pins, with 7 pins removed at the locations corresponding to the 7 feeding injectors. The pins had a square cross section, with a dimension of about 1 mm by 1 mm and a height about 4 mm.

The housing and the partitioner were made of thermal-insulating plastics then coated with an epoxy coating to render the surface impermeable to the refrigerant. The boiler plate was connected to the base of the housing of the phase-separated evaporator by epoxy adhesive. The partitioner had 7 tapered feeding injectors toward the boiler plate, immediately above the landing zones located at the spaces formed by the removed pins.

In the condenser, the condenser core was constructed with 40 blades of copper blank. Each blade had a length about 127 mm, a width about 44.5 mm, and a thickness about 0.17 mm. The blades were substantially planar, and the distance between two adjacent blades was about 1.5 mm.

On each blade, three multi-slot apertures as illustrated in FIG. 16B were produced using wire EDM. Each slot had a width about 0.25 mm. The pair of longest slots (546a) had a total length of about 18 mm, and the pair of shortest slots (546b) had a total length of about 8 mm. Two positioning apertures (569) were provided for each multi-slot aperture for alignment of the spacer ring.

The spacer rings were made of plastics, which had an oblong shape, with a width of about 17 mm, a length of about 25 mm and a height of about 1.5 mm. On the lower side of the spacer ring, there were two positional bumps (not shown, about 0.5 mm in height) complementary to the two positioning apertures (569) on the blade. On the upper side of the spacer ring, there were two positional dimples (567, about 0.5 mm in depth) complementary to the two positional bumps on the lower side of the spacer rings. Two spacer rings, above and below one blade, were aligned by inserting the positioning bumps through the positioning apertures into the positioning dimples underneath the blade. Each spacer ring was attached to the blade by epoxy adhesive to form an air and liquid tight connection. As such, three spacer rings were positioned around the multi-slot apertures between every two adjacent blades, and the process was repeated to form the condenser core.

The input manifold and output manifold were in a form of rectangular case, hermetically sealed to the condenser core by epoxy adhesive. The input manifold and output manifold were made of thermal-insulating plastics and coated with epoxy.

Vacuum is applied to the hermetically sealed system through a sealable opening on the condensate conduit, such as a valve, then about 65 ml of Genetron® refrigerant 245FA from Honeywell was added into the evaporator through the condensate conduit.

Figure 18:
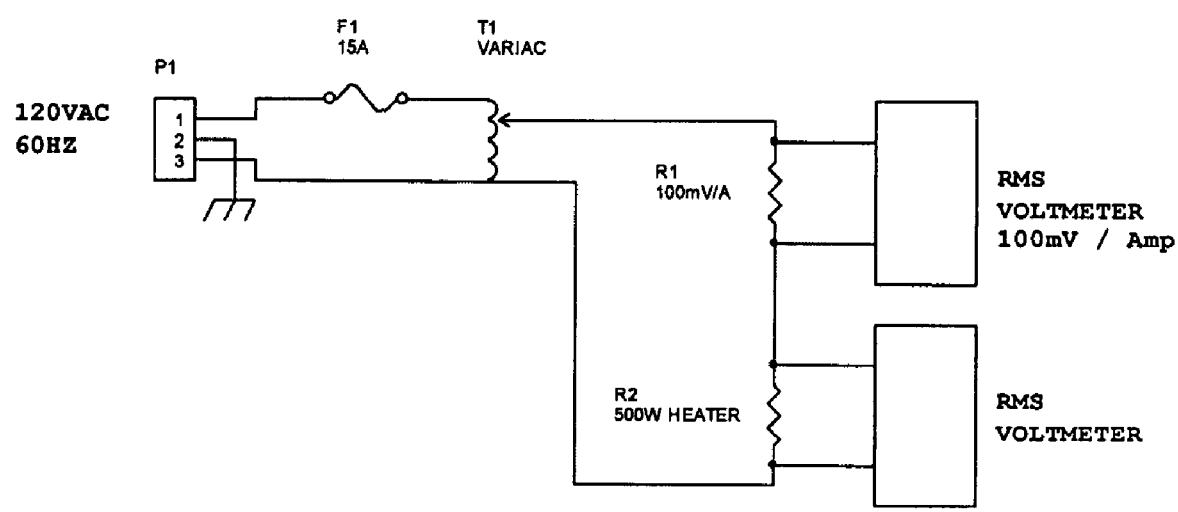
FIG. 18 is the test power circuit used in the Example.

Heat dissipation efficiency of the heat dissipation system described above was tested in comparison to a commercial ThermalRight XP90C 4-tube heat pipe. The test used a variable AC transformer (Variac) to apply an AC voltage to a heater cartridge, which was in direct contact with the bottom surface of the boiler plate. A current sense resistor allowed the current to be measured with a voltmeter to avoid circuit path errors. Both voltage measurements were performed with true RMS voltmeters. The fan was powered by a precise 12.00V. The ambient air and the simulated die face temperature were measured with thermocouples. The test power circuit is illustrated in FIG. 18.

Figure 20B:
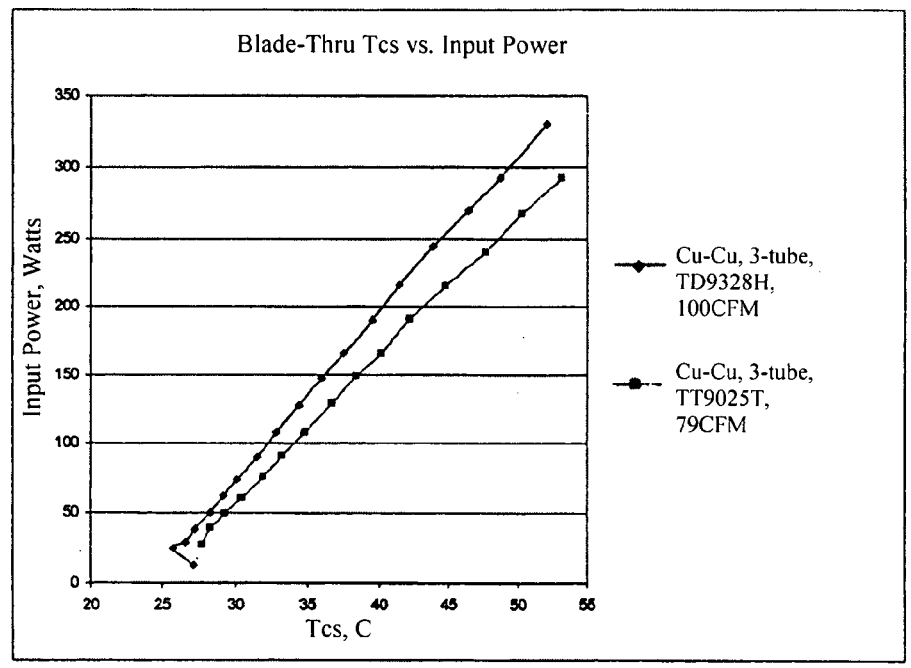

The test results using two different fan speeds (100 CFM and 79 CFM) are shown in FIGS. 19A thru 20B. FIGS. 19B and 20B show the curves of input power to the heater cartridge vs. the temperature of the simulated die face of a CPU. As shown in FIG. 19B, with the fan speed of 100 CFM, when ThermalRight XP90C was used as the heat dissipation device, the temperature of the simulated die face reached about 60° C. when the input wattage was 170W. However, as shown in FIG. 20B when the instant heat dissipation system described above was used, the temperature of the simulated die face was maintained below 55° C., when the input wattage to the heater cartridge was about 330W, which was nearly double of 170W.

FIGS. 19A and 20A show the curves of heat resistance ($\theta cs$) of the simulated die face of CPU vs. input power to the heater cartridge. As shown in FIG. 19A, when ThermalRight XP90C was used, with the fan speed of 100 CFM, the heat resistance $\theta cs$ of the simulated die face of CPU was about 0.22 (C/W) when the input power was about 170W. As shown in FIG. 20A, when the instant heat dissipation system described above was used, with the same fan speed, the heat resistance of the simulated die face of CPU was about 0.08 (CAN) when the input power was about 330W.

The invention has been described with reference to particularly preferred embodiments. It will be appreciated, however, that various changes can be made without departing from the spirit of the invention, and such changes are intended to fall within the scope of the appended claims. While the present invention has been described in detail and pictorially shown in the accompanying drawings, these should not be construed as limitations on the scope of the present invention, but rather as an exemplification of preferred embodiments thereof. It will be apparent, however, that various modifications and changes can be made within the spirit and the scope of this invention as described in the above specification and defined in the appended claims and their legal equivalents. All patents and other publications cited herein are expressly incorporated by reference.

What is claimed is:

1. A phase-separated evaporator comprising:
    (a) a boiler plate; and
    (b) a phase separation chamber comprising:
        (i) a housing having a base connected to said boiler plate; said housing having a liquid port and a gas port; and
        (ii) a phase partitioner connected to interiors of said housing, dividing said phase-separated evaporator into a condensate directing compartment and a vapor directing compartment; said condensate directing compartment being in communication with said liquid port, and said vapor directing compartment being in communication with said gas port, wherein said phase partitioner includes a partition panel and a plurality of feeding injectors extending from a lower surface of said partition panel toward an upper surface of said boiler plate.

2. The phase-separated evaporator of claim 1, wherein each of said feeding injectors has an injector inlet and an opposing injector tip; and said injector tip is disposed immediately above said upper surface of said boiler plate.

3. The phase-separated evaporator of claim 1, wherein said partition panel has an opening for balancing pressure between said condensate directing compartment and said vapor directing compartment.

4. The phase-separated evaporator of claim 1, wherein said liquid port and said gas port are positioned on a side wall of said housing; and said liquid port is disposed between a top wall of said housing and said partition panel, and said gas port is disposed between said partition panel and said boiler plate.

5. The phase-separated evaporator of claim 1, wherein a top wall of said housing and said partition panel incline along a longitudinal axis of said phase separation chamber toward said boiler plate; and said partition panel is substantially in parallel with said top wall.

6. The phase-separated evaporator of claim 2, wherein said upper surface of said boiler plate is coated with a micro porous coating material.

7. The phase-separated evaporator of claim 6, wherein said upper surface of said boiler plate comprises a plurality of pins extending upward therefrom.

8. The phase-separated evaporator of claim 7, wherein said injector tips are disposed in spaces among said plurality of pins of said boiler plate.

9. The phase-separated evaporator of claim 7, wherein said boiler plate comprises a plurality of landing zones on said upper surface in spaces among said pins, surfaces of said landing zones being substantially free of said micro porous coating material; and said injector tips are disposed immediately above said landing zones.

10. The phase-separated evaporator of claim 1, wherein said phase partitioner and said housing are made of a thermal-insulating material.

11. The phase-separated evaporator of claim 1, wherein a top wall of said housing has an inclined section covering substantially an upper surface of said boiler plate along a longitudinal axis of said phase separation chamber, and a port section adjacent to, and vertically extending above, said inclined section; and said liquid port and said gas port are positioned on top of said port section.

12. The phase-separated evaporator of claim 11, wherein said partition panel includes an inclined panel substantially in parallel with said inclined section of said top wall of said housing and a vertical section extending from one end of said inclined panel upwardly within said port section; and said inclined panel comprises a plurality of feeding injectors extending therefrom toward said boiler plate.

13. A heat dissipation system comprising:
   (a) a phase-separated evaporator, comprising:
   (i) a boiler plate; and
   (ii) a phase separation chamber comprising a housing and a phase partitioner; said housing having a base connected to said boiler plate and having a liquid port and a gas port; and said phase partitioner being connected to interiors of said housing, dividing said phase-separated evaporator into a condensate directing compartment and a vapor directing compartment; said condensate directing compartment being in communication with said liquid port, and said vapor directing compartment being in communication with said gas port, wherein said phase partitioner includes a partition panel and a plurality of feeding injectors extending from a lower surface of said partition panel toward an upper surface of said boiler plate;
   (b) a condenser;
   (c) a vapor conduit connected between said gas port of said evaporator and an input interface of said condenser; and
   (d) a condensate conduit connected between an output interface of said condenser and said liquid port of said evaporator.

14. The heat dissipation system of claim 13 further comprising a fan positioned adjacent to said condenser, for removing hot air released from said condenser.

15. A computer system comprising:
   a heat dissipation system, adapted to be disposed within a computer housing, comprising a phase-separated evaporator, a condenser, and a coolant hermetically sealed therein; said phase-separated evaporator comprising:
   (i) a boiler plate being in direct contact with a heat generating component of said computer system; and
   (ii) a phase separation chamber comprising a housing and a phase partitioner; said housing having a base connected to said boiler plate and having a liquid port and a gas port; and said phase partitioner being connected to interiors of said housing, dividing said phase-separated evaporator into a condensate directing compartment and a vapor directing compartment; said condensate directing compartment being in communication with said liquid port, and said vapor directing compartment being in communication with said gas port, wherein said phase partitioner includes a partition panel and a plurality of feeding injectors extending from a lower surface of said partition panel toward an upper surface of said boiler plate.

* * * * *